United States Patent
Mokhlesi et al.

(10) Patent No.: US 7,957,187 B2
(45) Date of Patent: Jun. 7, 2011

(54) DYNAMIC AND ADAPTIVE OPTIMIZATION OF READ COMPARE LEVELS BASED ON MEMORY CELL THRESHOLD VOLTAGE DISTRIBUTION

(75) Inventors: Nima Mokhlesi, Los Gatos, CA (US); Henry Chin, Palo Alto, CA (US)

(73) Assignee: Sandisk Corporation, Milpitas, CA (US)

( * ) Notice: Subject to any disclaimer, the term of this patent is extended or adjusted under 35 U.S.C. 154(b) by 229 days.

(21) Appl. No.: 12/338,850

(22) Filed: Dec. 18, 2008

(65) Prior Publication Data

US 2009/0282186 A1    Nov. 12, 2009

Related U.S. Application Data

(60) Provisional application No. 61/052,156, filed on May 9, 2008.

(51) Int. Cl.
 *G11C 16/04* (2006.01)
(52) U.S. Cl. ......... 365/185.03; 365/185.19; 365/185.24; 365/189.07; 365/189.04
(58) Field of Classification Search ............ 365/185.03, 365/185.19, 185.24, 189.07, 189.04
See application file for complete search history.

(56) References Cited

U.S. PATENT DOCUMENTS

| | | | |
|---|---|---|---|
| 5,920,501 A | 7/1999 | Norman | |
| 5,963,473 A | 10/1999 | Norman | |
| 7,181,565 B2 | 2/2007 | Surico | |
| 7,315,917 B2 | 1/2008 | Bennett | |
| 2007/0217258 A1* | 9/2007 | Wang | ........................ 365/185.03 |
| 2008/0263266 A1 | 10/2008 | Sharon | |
| 2008/0285351 A1 | 11/2008 | Schlick | |

OTHER PUBLICATIONS

Murin, et al., U.S. Appl. No. 12/111,729, filed Apr. 29, 2008, "Method for Adaptive Setting of State Voltage Levels in Non-Volatile Memory,".

* cited by examiner

*Primary Examiner* — Thong Q Le
(74) *Attorney, Agent, or Firm* — Vierra Magen Marcus & DeNiro LLP

(57) ABSTRACT

A process is performed periodically or in response to an error in order to dynamically and adaptively optimize read compare levels based on memory cell threshold voltage distribution. One embodiment of the process includes determining threshold voltage distribution data for a population of non-volatile storage elements, smoothing the threshold voltage distribution data using a weighting function to create an interim set of data, determining a derivative of the interim set of data, and identifying and storing negative to positive zero crossings of the derivative as read compare points.

29 Claims, 20 Drawing Sheets

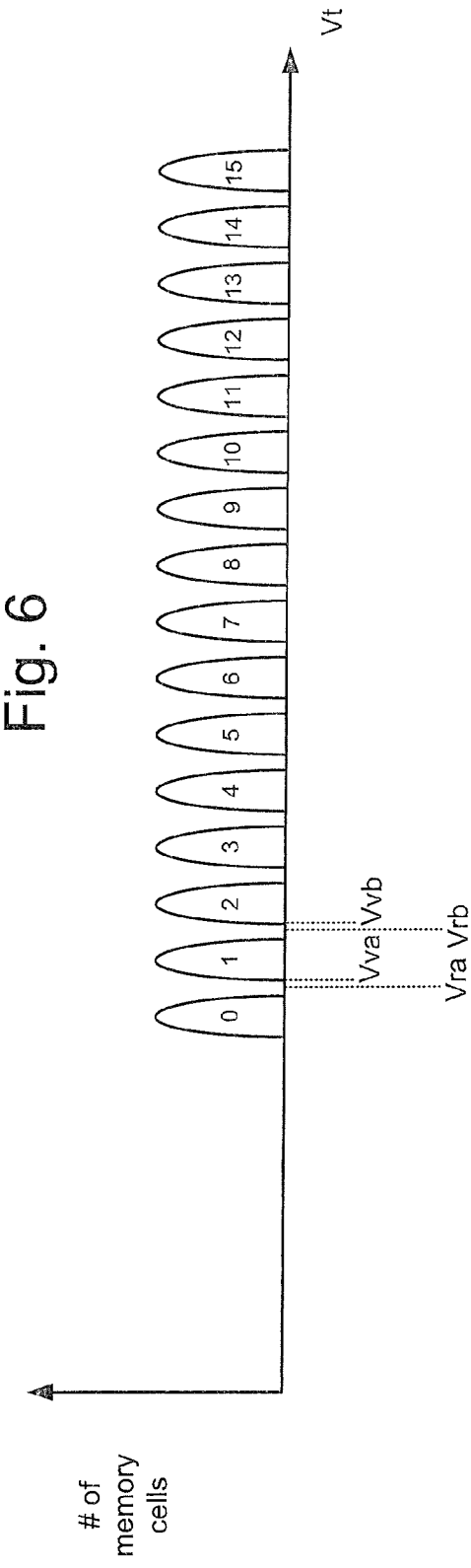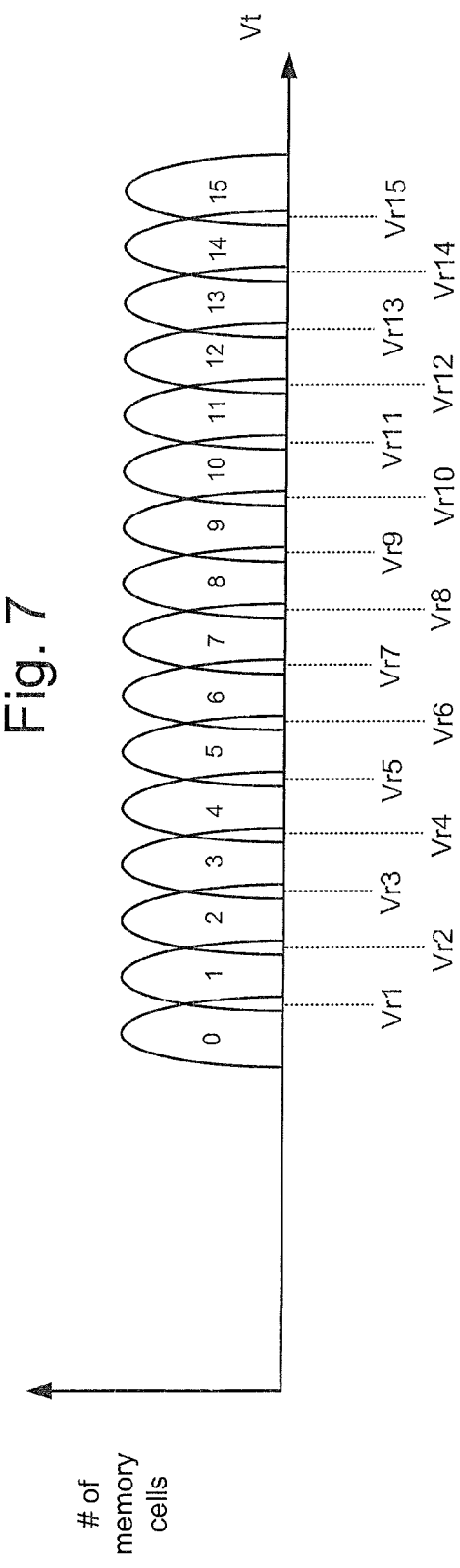

Fig. 8

| state | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 4th Top Page | 1 | 0 | 1 | 0 | 1 | 0 | 1 | 0 | 1 | 0 | 1 | 0 | 1 | 0 | 1 | 0 |
| 3rd Higher Page | 1 | 1 | 0 | 0 | 1 | 1 | 0 | 0 | 1 | 1 | 0 | 0 | 1 | 1 | 0 | 0 |
| 2nd Upper Page | 1 | 1 | 1 | 1 | 0 | 0 | 0 | 0 | 1 | 1 | 1 | 1 | 0 | 0 | 0 | 0 |
| 1st Lower Page | 1 | 1 | 1 | 1 | 1 | 1 | 1 | 1 | 0 | 0 | 0 | 0 | 0 | 0 | 0 | 0 |

Fig. 9

| state | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 4th Top Page | 1 | 0 | 0 | 1 | 1 | 0 | 0 | 1 | 1 | 0 | 0 | 1 | 1 | 0 | 0 | 1 |
| 3rd Higher Page | 1 | 1 | 0 | 0 | 0 | 0 | 1 | 1 | 1 | 1 | 0 | 0 | 0 | 0 | 1 | 1 |
| 2nd Upper Page | 1 | 1 | 1 | 1 | 1 | 1 | 1 | 0 | 0 | 0 | 0 | 0 | 1 | 1 | 1 | 1 |
| 1st Lower Page | 1 | 1 | 1 | 1 | 1 | 1 | 1 | 1 | 0 | 0 | 0 | 0 | 0 | 0 | 0 | 0 |

Fig. 20

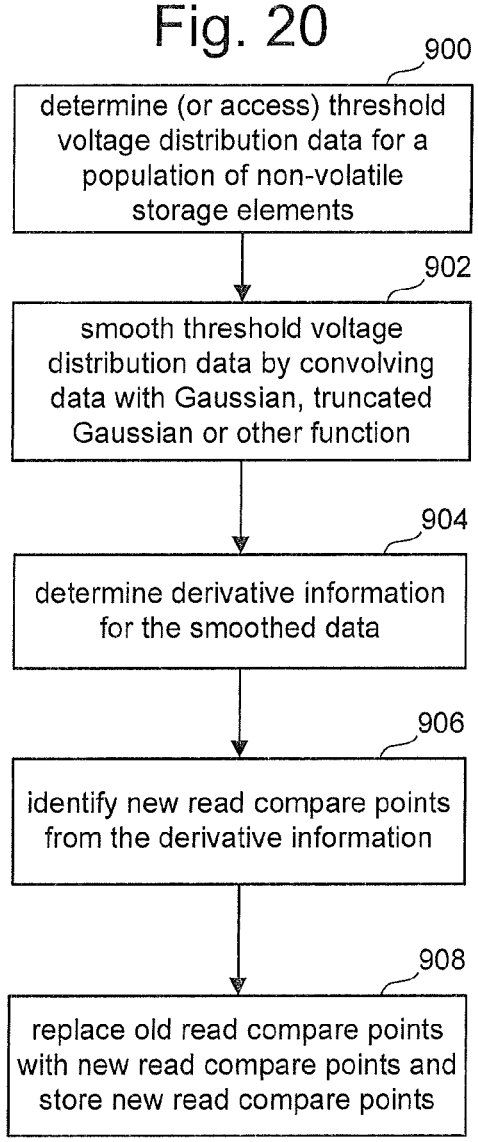

900 — determine (or access) threshold voltage distribution data for a population of non-volatile storage elements 902 — smooth threshold voltage distribution data by convolving data with Gaussian, truncated Gaussian or other function 904 — determine derivative information for the smoothed data 906 — identify new read compare points from the derivative information 908 — replace old read compare points with new read compare points and store new read compare points

Fig. 21

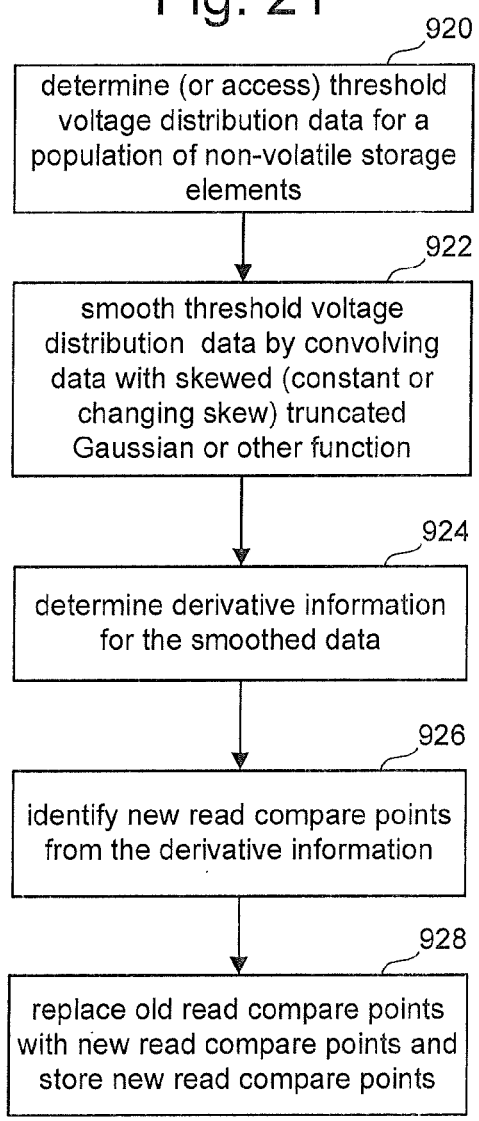

920 — determine (or access) threshold voltage distribution data for a population of non-volatile storage elements 922 — smooth threshold voltage distribution data by convolving data with skewed (constant or changing skew) truncated Gaussian or other function 924 — determine derivative information for the smoothed data 926 — identify new read compare points from the derivative information 928 — replace old read compare points with new read compare points and store new read compare points

Fig. 20A

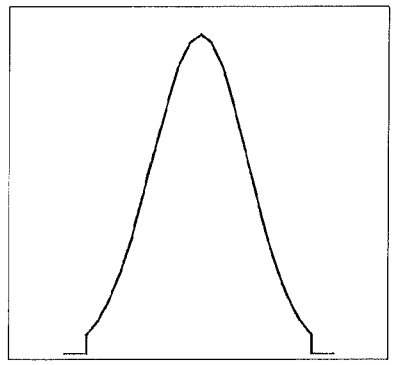

Fig. 21A

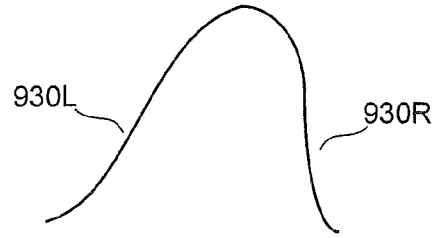

930L, 930R

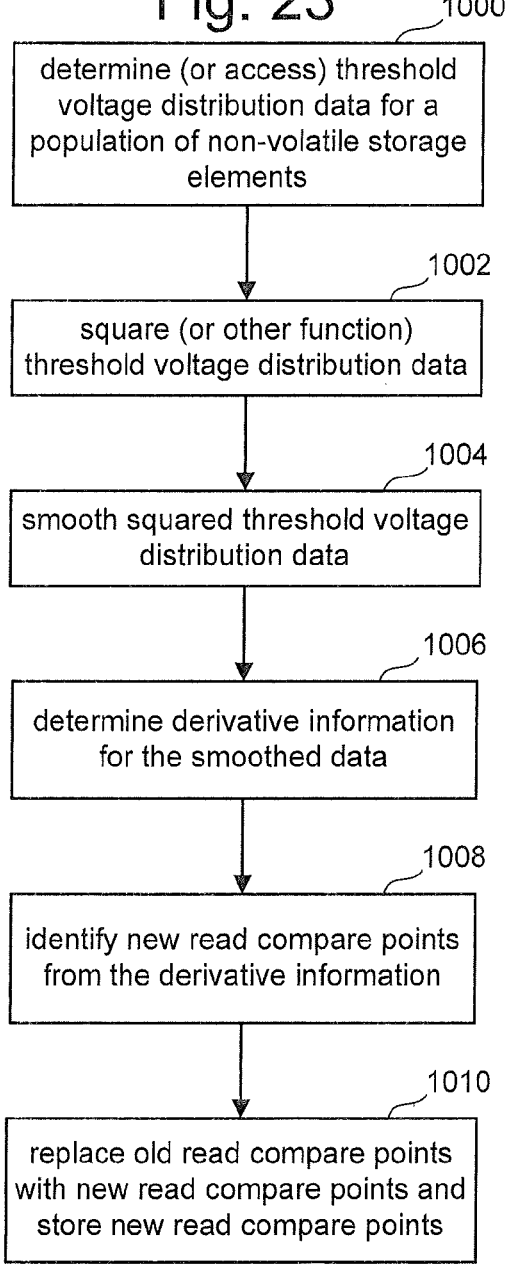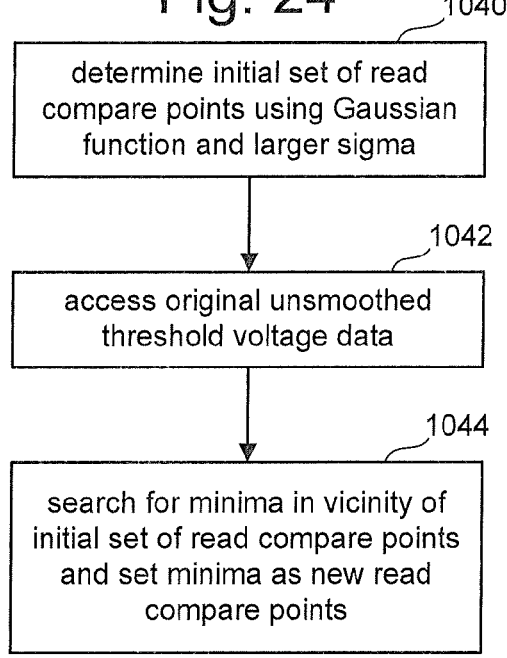

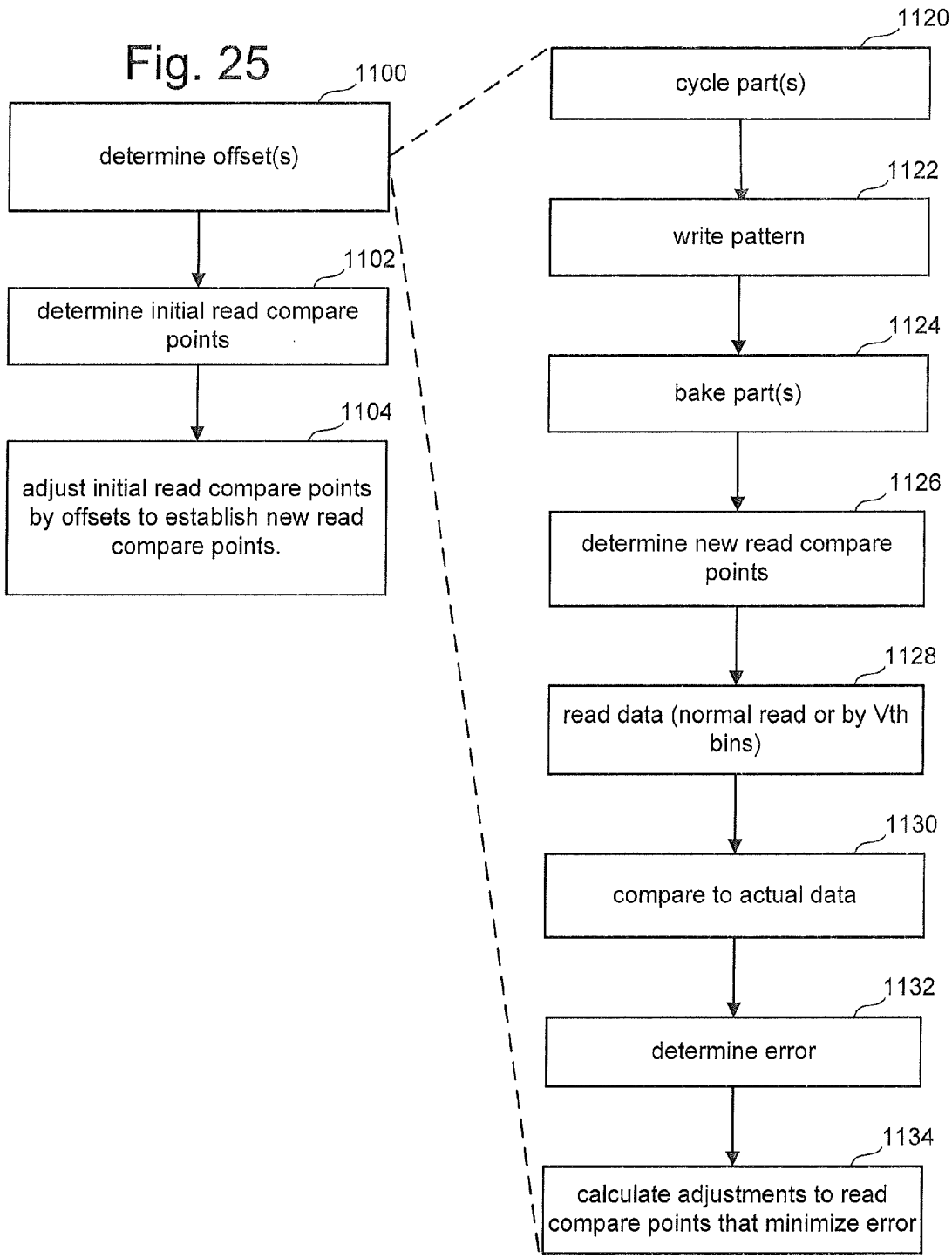

DYNAMIC AND ADAPTIVE OPTIMIZATION OF READ COMPARE LEVELS BASED ON MEMORY CELL THRESHOLD VOLTAGE DISTRIBUTION

CLAIM OF PRIORITY

This application claims the benefit of U.S. Provisional Application No. 61/052,156 "Dynamic And Adaptive Optimization Of Read Compare Levels Based On Memory Cell Threshold Voltage Distribution," by Nima Mokhlesi and Henry Chin, filed on May 9, 2008, incorporated herein by reference.

BACKGROUND OF THE INVENTION

1. Field of the Invention

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate and channel regions are positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique for Non-Volatile Memory;" U.S. Pat. No. 6,917,542, titled "Detecting Over Programmed Memory;" and U.S. Pat. No. 6,888,758, titled "Programming Non-Volatile Memory," all three cited patents are incorporated herein by reference in their entirety.

In many cases, the program voltage is applied to the control gate as a series of pulses (referred to as programming pulses), with the magnitude of the pulses increasing at each pulse. Between programming pulses, a set of one or more verify operations are performed to determine whether the memory cell(s) being programmed have reached their target level. If a memory cell has reached its target level, programming stops for that memory cell. If a memory cell has not reached its target level, programming will continue for that memory cell.

Some EEPROM and flash memory devices have a floating gate that is used to store two ranges of charges and, therefore, the memory cell can be programmed/erased between two states (an erased state and a programmed state). Such a flash memory device is sometimes referred to as a binary memory device.

A multi-state memory device stores multiple bits of data per memory cell by identifying multiple distinct valid threshold voltage distributions (or data states) separated by forbidden ranges. Each distinct threshold voltage distribution corresponds to a predetermined value for the set of data bits encoded in the memory device. For example, a memory cell that stores two bits of data uses four valid threshold voltage distributions. A memory cell that stores three bits of data uses eight valid threshold voltage distributions.

Although non-volatile memory has proven to be very reliable, sometimes errors can occur. Many memory systems uses Error Correction Codes (ECC) to correct errors found during a read process. Sometime, however, ECC cannot correct all errors.

SUMMARY OF THE INVENTION

A process is performed to dynamically and adaptively optimize the read compare levels based on memory cell threshold voltage distribution. The read compare levels are used to perform a read operation. By optimizing the read compare levels, the accuracy of the read operation will be improved.

One embodiment includes accessing threshold voltage distribution data for a population of non-volatile storage elements, operating on the threshold voltage distribution data to create transformed threshold voltage distribution data, and identifying read compare points based on the transformed threshold voltage distribution data.

One embodiment includes accessing threshold voltage distribution data for a population of non-volatile storage elements, smoothing the threshold voltage distribution data, determining derivative information for the smoothed data, and identifying read compare points from the derivative information.

One embodiment includes determining threshold voltage distribution data for a population of non-volatile storage elements, smoothing said threshold voltage distribution data using a weighted function to create an interim set of data, determining a derivative of the interim set of data, identifying new read compare values based on negative to positive zero crossings of the derivative, and performing one or more read operations using the new read compare values.

One embodiment includes determining threshold voltage distribution data for a population of flash memory devices, convolving said threshold voltage distribution data with a Gaussian function to create an interim set of data, determining a derivative of the interim set of data, identifying negative to positive zero crossings of the derivative, storing new read compare values based on the identified negative to positive zero crossings of the derivative, and performing one or more read operations using the new read compare values.

One example implementation includes a two or three dimensional array of non-volatile storage elements and one or more managing circuits in communication with the non-volatile storage elements. The one or more managing circuits perform any of the processes described herein, including accessing threshold voltage distribution data for a population of non-volatile storage elements, smoothing the threshold voltage distribution data, determining derivative information for the smoothed data, and identifying read compare points from the derivative information.

One example implementation includes plurality of non-volatile storage elements, means for accessing threshold voltage distribution data for the non-volatile storage elements, means for operating on the threshold voltage distribution data to create transformed threshold voltage distribution data, and means for identifying read compare points based on the transformed threshold voltage distribution.

BRIEF DESCRIPTION OF THE DRAWINGS

FIG. 6 depicts an example set of threshold voltage distributions.

FIG. 7 depicts an example set of threshold voltage distributions.

FIG. 8 depicts an example coding of data into a set of data states associated with threshold voltage distributions.

FIG. 9 depicts an example coding of data into a set of data states associated with threshold voltage distributions.

FIG. 20 is a flow chart describing one embodiment of a process for updating read compare levels.

FIG. 20A depicts a truncated Gaussian curve.

FIG. 21 is a flow chart describing one embodiment of a process for updating read compare levels.

FIG. 21A depicts an asymmetrical threshold voltage distribution.

FIG. 23 is a flow chart describing one embodiment of a process for updating read compare levels.

FIG. 24 is a flow chart describing one embodiment of a process for updating read compare levels.

FIG. 25 is a flow chart describing one embodiment of a process for updating read compare levels.

DETAILED DESCRIPTION

Figure 1:
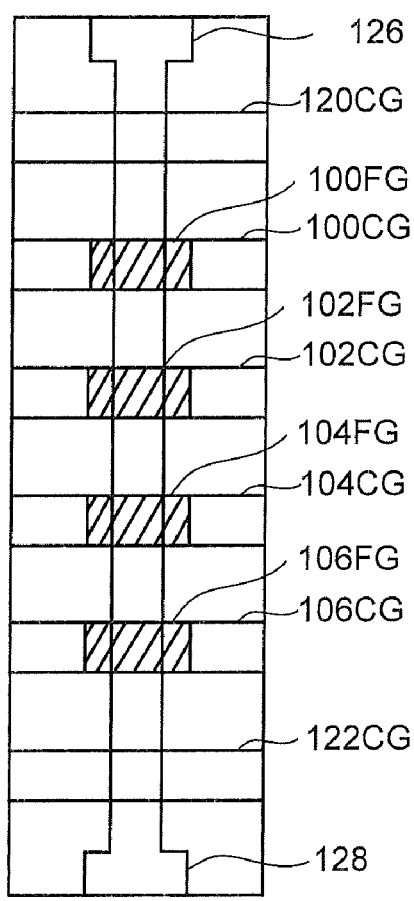
FIG. 1 is a top view of a NAND string.
Figure 2:
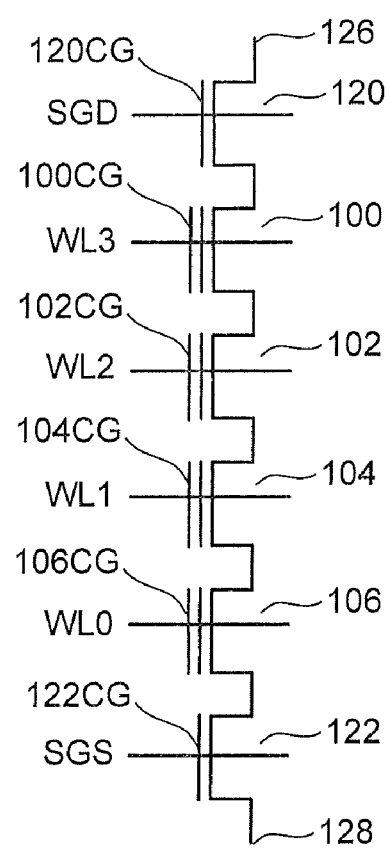
FIG. 2 is an equivalent circuit diagram of the NAND string.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have fewer than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. Patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND as well as other types of non-volatile memory.

Other types of non-volatile storage devices, in addition to NAND flash memory, can also be used. For example, a so called TANOS structure (consisting of a stacked layer of TaN—Al2O3—SiN—SiO2 on a silicon substrate), which is basically a memory cell using trapping of charge in a nitride layer (instead of a floating gate), can also be used with the present invention. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices (utilizing floating gates or not utilizing floating gates) can also be used.

Figure 3:
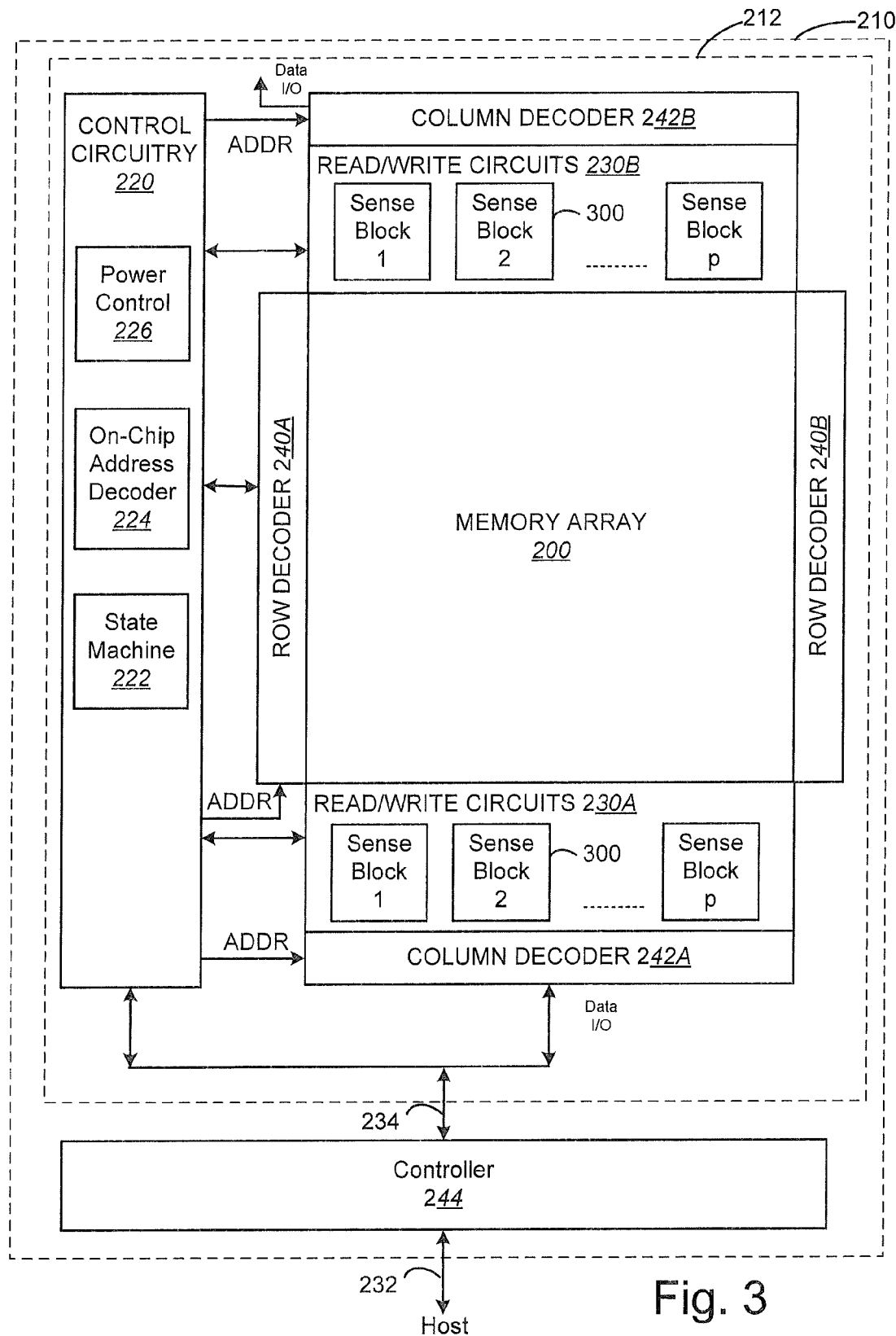
FIG. 3 is a block diagram of a non-volatile memory system.

FIG. 3 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 100 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
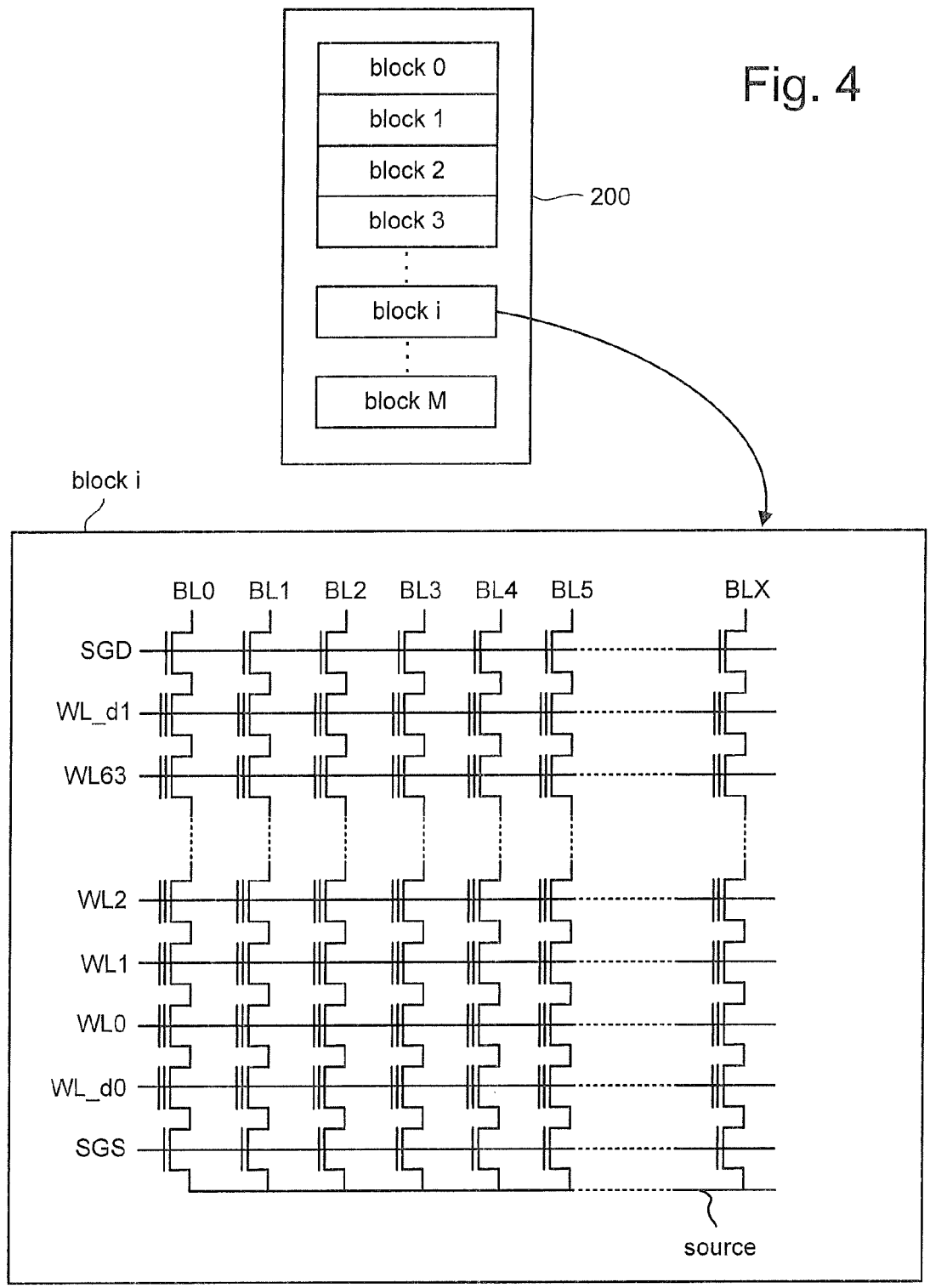
FIG. 4 is a block diagram depicting one embodiment of a memory array.

FIG. 4 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 4 shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or less than 64 data memory cells and two dummy memory cells. Data memory cells can store user or system data. Dummy memory cells are typically not used to store user or system data. Some embodiments do not include dummy memory cells.

Figure 5:
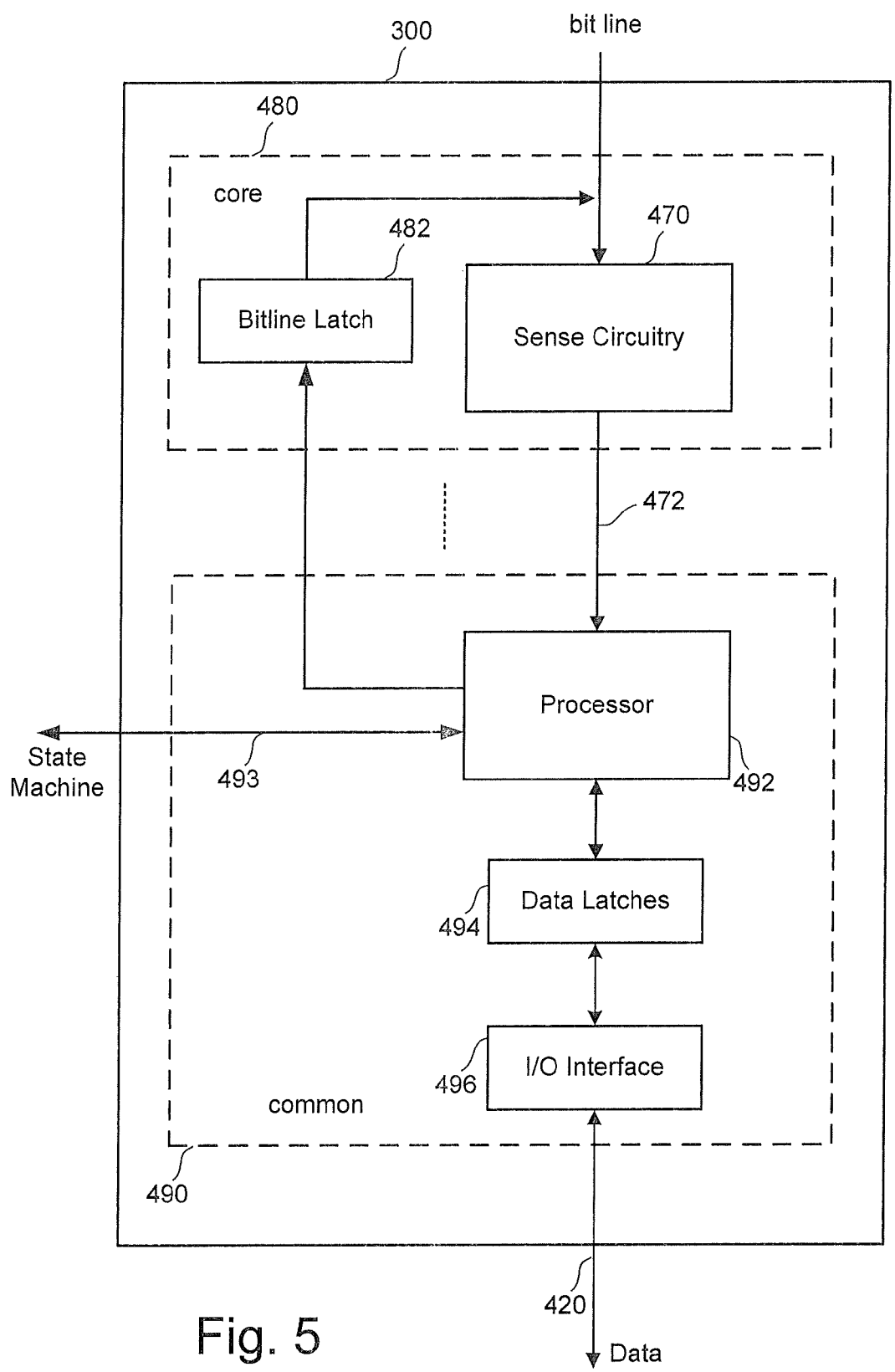
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cemea, filed on Dec. 28, 2005. All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions corresponding to data states for the memory cell array when each memory cell stores four bits of data. Other embodiment, however, may use more or less than four bits of data per memory cell. FIG. 6 shows sixteen threshold voltage distributions corresponding to data states 0-15. In one embodiment, the threshold voltages in state 0 are negative and the threshold voltages in the states 1-15 are positive. The division of data states being positive or negative is not limited by the technology described herein.

In one embodiment five states are in negative voltages and eleven states are in positive voltages. To sense data for the negative voltages, the p-well and source lines can be driven (e.g. 1.6 volts) to allow for negative sensing.

Between each pair of adjacent states in the data states 0-15 is a read reference voltage used for reading data from memory cells. For example, FIG. 6 shows read reference voltage Vra between data states 0 and 1, and Vrb between data states 1 and 2. By testing whether the threshold voltage of a given memory cell is above or below the respective read reference voltages, the system can determine what state the memory cell is in.

At or near the lower edge of each data state 0-15 is a verify reference voltage. For example, FIG. 6 shows Vv1 for state 1 and Vv2 for state 2. When programming memory cells to a given state, the system will test whether those memory cells have a threshold voltage greater than or equal to the verify reference voltage.

FIG. 7 illustrates that another embodiment of threshold voltage distributions corresponding to data states 0-15 that can partially overlap since the ECC can handle a certain percentage of cells that are in error.

Also note that the Vt axis may be offset from actual voltages applied to the control gates as body effect through source and p-well or body biasing is used to shift negative threshold voltage into the measurable positive range. Another point to note is that contrary to the equal spacing/width of the depicted sixteen states, various states may have different widths/spacings in order to accommodate varying amounts of susceptibility to retention loss. In some embodiments, states 0 and/or 15 are wider than the other states. In other embodiment, states near the center of the Vt window will be more closely spaced than states near the two edges of the window, creating a more gradual change in state widths.

Each data state of FIG. 6 or FIG. 7 corresponds to predetermined values for the data bits stored in the memory cells programmed to the respective states. FIG. 8 is a table providing an example of the data values assigned to each data state 0-15. In one embodiment, a memory cell stores data in four different pages. The four pages are referred to as the $1^{st}$ lower page, $2^{nd}$ upper page, $3^{rd}$ higher page and $4^{th}$ top page. FIG. 8 depicts the data in each page for each data state 0-15. In one embodiment, each page is programmed separately. In another embodiment, all four data bits for a memory cell are programmed at the same time.

FIG. 9 is a table providing another example of the data values assigned to each data state 0-15. The data values of FIG. 9 utilize a Gray code assignment so that only one bit changes between neighboring data states. This arrangement reduces the number of error bits if the threshold voltage of a memory cells is too low or too high.

Figure 10:
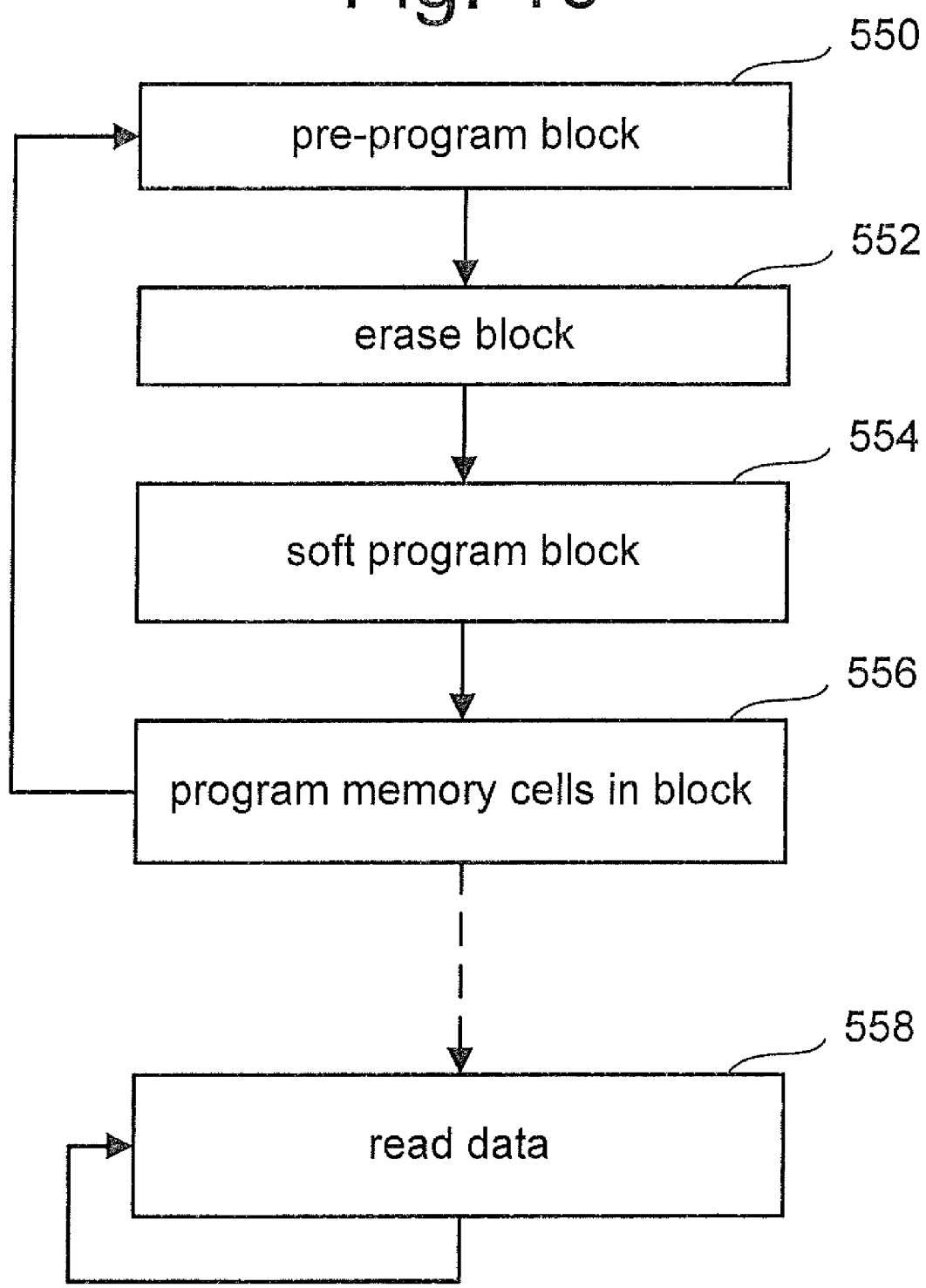
FIG. 10 is a flow chart describing one embodiment of operating a non-volatile memory system.

FIG. 10 is a flow chart describing a process for operating memory cells connected to a selected word line. In one embodiment, the process of FIG. 10 is used to program a block of memory cells. In one implementation of the process of FIG. 10, memory cells are pre-programmed in order to maintain even wear on the memory cells (step 550). In one embodiment, the memory cells are preprogrammed to state 15, a random pattern, or any other pattern. In some implementations, pre-programming need not be performed.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that a selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of cells. In one embodiment, after erasing the memory cells, all of the erased memory cells will be in state 0 (see FIGS. 6 & 7). One implementation of an erase process includes applying several erase pulses to the p-well and verifying between erase pulses whether the NAND strings are properly erased.

At step 554, soft programming is performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells closer to the erase verify level. In step 556, the memory cells of the block are programmed. The process of FIG. 10 can be performed at the direction of the state machine using the various circuits described above. In other embodiments, the process of FIG. 10 can be performed at the direction of the controller using the various circuits described above. After performing the process of FIG. 10, the memory cells of the block can be read (step 558). FIG. 10 shows that the erase-program cycle can happen many times without or independent of reading, the read process can occur many times without or independent of programming, and the read process can happen any time after programming.

Figure 11:
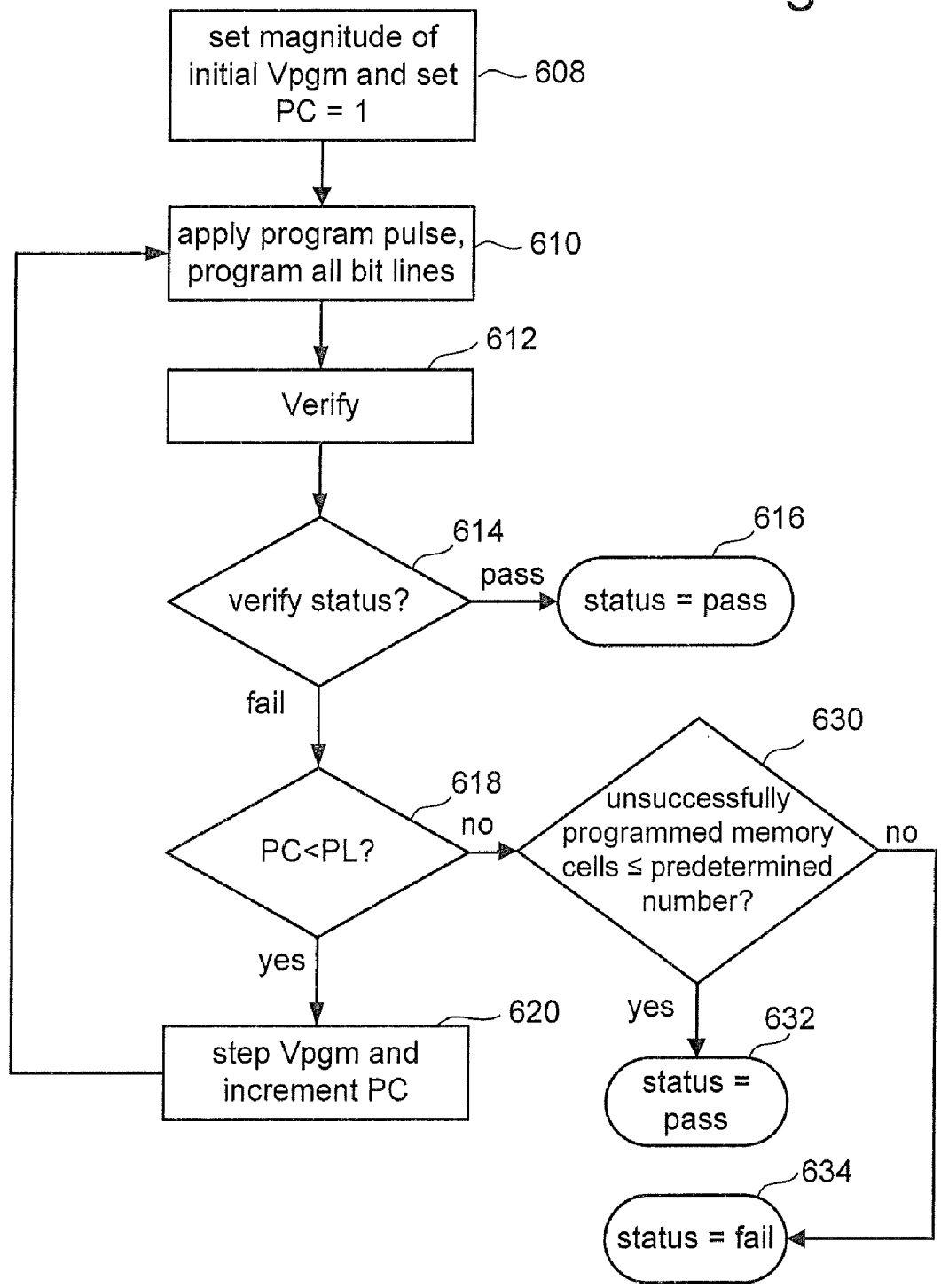
FIG. 11 is a flow chart describing one embodiment of programming a non-volatile memory system.

FIG. 11 is a flow chart describing one embodiment of a process for performing programming on memory cells connected to a common word line. The process of FIG. 10 can be performed one or multiple times during step 556 of FIG. 10. The process of FIG. 11 can be used to program memory cells from state 0 directly to any of states 1-15. Alternatively, the process of FIG. 15 can be used as part of another programming process, such as those disclosed in U.S. Pat. No. 7,196,928. Many different programming processes are known in the art. The technology described herein is not limited to any particular process for programming. Many different programming processes will work with the technology described herein.

Typically, the program voltage applied to the control gate during a program operation is applied as a series of program pulses. In between programming pulses are a set of verify pulses to enable verification. In many implementations, the magnitude of the program pulses is increased with each successive pulse by a predetermined step size. In step 608 of FIG. 11, the programming voltage (Vpgm) is initialized to the starting magnitude (e.g., ~12-16V or another suitable level) and a program counter PC maintained by state machine 222 is initialized at 1. In step 610, a program pulse of the program signal Vpgm is applied to the selected word line (the word line selected for programming). The unselected word lines receive one or more boosting voltages (e.g., ~9 volts) to perform boosting schemes known in the art. If a memory cell should be programmed, then the corresponding bit line is grounded. On the other hand, if the memory cell should remain at its current threshold voltage, then the corresponding bit line is connected to $V_{DD}$ to inhibit programming. More information about boosting schemes can be found in U.S. Pat. No. 6,859,397 and U.S. patent application Ser. No. 11/555,850, both of which are incorporated herein by reference.

In step 610, the program pulse is concurrently applied to all memory cells connected to the selected word line so that all of the memory cells connected to the selected word line are programmed together. That is, they are programmed at the same time (or during overlapping times). In this manner all of the memory cells connected to the selected word line will concurrently have their threshold voltage change, unless they have been locked out from programming.

In step 612, the states of the selected memory cells are verified using the appropriate set of target levels. Step 612 of FIG. 10 includes performing one or more verify operations. If it is detected that the threshold voltage of a selected memory cell has reached the appropriate target level, then the memory cell is locked out of further programming by, for example, raising its bit line voltage to Vdd during subsequent programming pulses. In step 614 it is checked whether all of memory cells have reached their target threshold voltages. If so, the programming process is complete and successful because all selected memory cells were programmed and verified to their target states. A status of "PASS" is reported in step 616. Note that in some implementations, in step 614 it is checked whether at least a predetermined number of memory cells have been properly programmed. This predetermined number can be less than the number of all memory cells, thereby allowing the programming process to stop before all memory cells have reached their appropriate verify levels. The memory cells that are not successfully programmed can be corrected using error correction during the read process.

If, in step 614, it is determined that not all of the memory cells have reached their target threshold voltages, then the programming process continues. In step 618, the program counter PC is checked against the program limit value (PL). One example of a program limit value is 20; however, other values can be used. If the program counter PC is not less than the program limit value, then it is determined in step 630 whether the number of memory cells that have not been successfully programmed is equal to or less than a predetermined number. If the number of unsuccessfully programmed memory cells is equal to or less than the predetermined number, then the programming process is flagged as passed and a status of PASS is reported in step 632. In many cases, the memory cells that are not successfully programmed can be corrected using error correction during the read process. If however, the number of unsuccessfully programmed memory cells is greater than the predetermined number, the program process is flagged as failed and a status of FAIL is reported in step 634.

If, in step 618, it is determined that the Program Counter PC is less than the Program Limit value PL, then the process continues at step 620 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 620, the process loops back to step 610 and another program pulse is applied to the selected word line.

Figure 12:
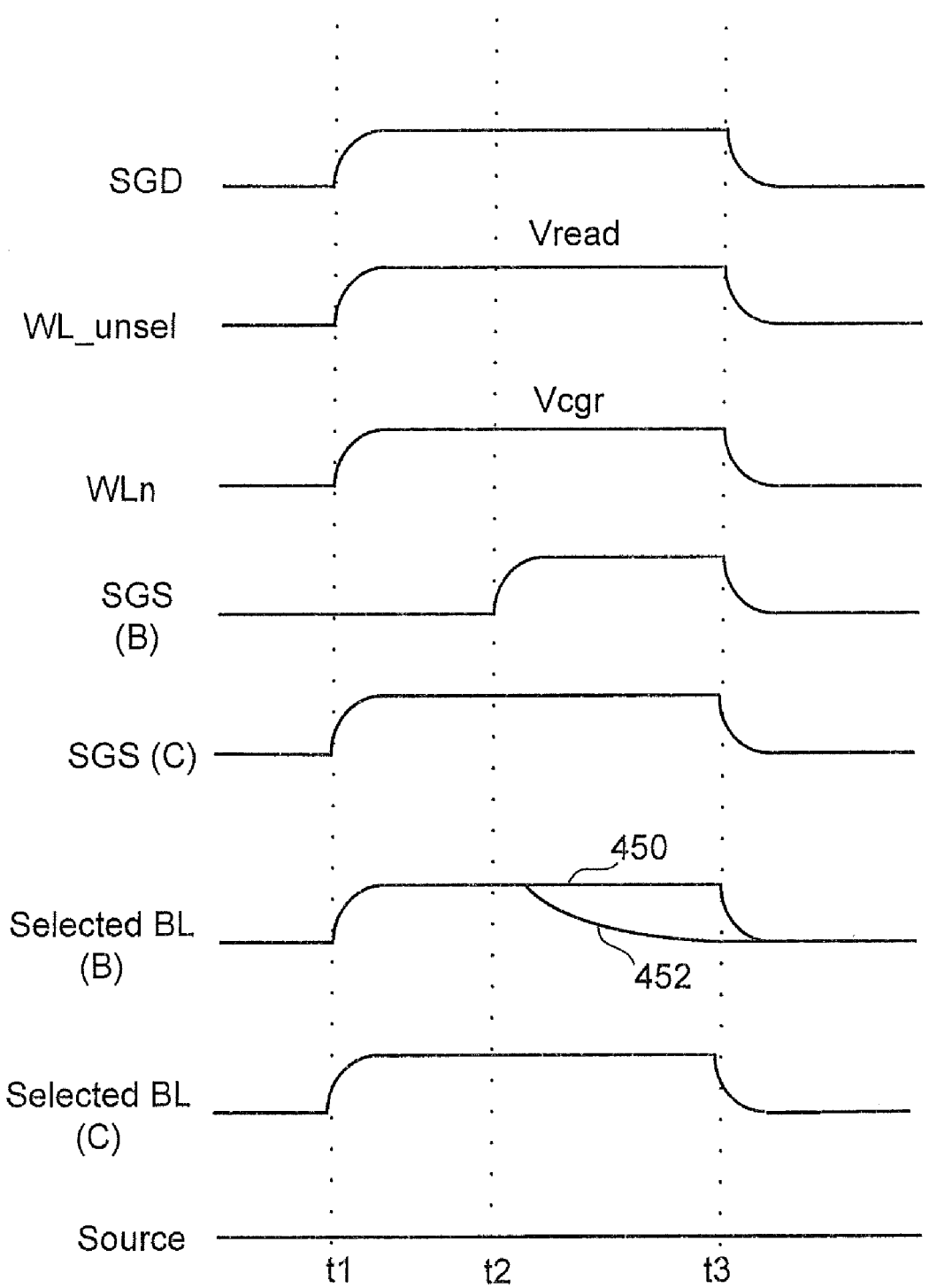
FIG. 12 is a signal diagram depicting a read operation.

FIG. 12 is a timing diagram depicting the behavior of various signals during one iteration of a read or verify process. For example, if the memory cells are binary memory cells, the process of FIG. 12 may be performed once for each memory cell during an iteration of step 612 or during a read process. If the memory cells are multi-state memory cells with sixteen states (e.g., states 0-15), the process of FIG. 12 may be performed fifteen times for each memory cell during an iteration of step 612 or during an attempt to read the data from the memory cell. For example, between each data state is a read compare point, such as Vra between state 0 and state 1 of FIG. 6 and Vrb between state 1 and state 2 of FIG. 6. There would be additional read compare points between the other sets of neighboring states. A read process would test whether the threshold voltage of a memory cell was below each of the fifteen read compare points. Based on the results of the fifteen tests, it can be determined which state the memory cell is in. For example, if the memory cell has a threshold voltage lower than Vrb but not lower then Vra, then the memory cell is in state 2. The verify process works in a similar manner, except the verify compare points Vva, Vvb, . . . are usually located at or near the lower edge of the state.

In general, during the read and verify operations, the selected word line is connected to a voltage, a level of which is specified for each read and verify operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge a voltage on the bit line. The charge on the bit line is measured after a period of time to see whether it has been discharged or not. FIG. 12 explains both examples.

FIG. 12 shows signals SGD, WL_unsel., WLn, SGS, Selected BL, and Source starting at Vss (approximately 0 volts). SGD represents the gate of the drain side select gate. SGS is the gate of the source side select gate. WLn is the word line selected for reading/verification. WL_unsel represents the unselected word lines. Selected BL is the voltage of the bit line selected for reading/verification. Source is the source line for the memory cells (see FIG. 4). Note that there are two versions of SGS and Selected BL. One set of these signals SGS (B) and Selected BL (B) depict a read/verify operation for an array of memory cells that measure the conduction current of a memory cell by determining whether the bit line has discharged. Another set of these signals SGS (C) and Selected BL (C) depict a read/verify operation for an array of memory cells that measure the conduction current of a memory cell by the rate it discharges a dedicated capacitor in the sense amplifier.

First, the behavior of the sensing circuits and the array of memory cells that are involved in measuring the conduction current of a memory cell by determining whether the bit line has discharged will be discussed with respect to SGS (B) and Selected BL (B). At time t1 of FIG. 12, SGD is raised to Vdd (e.g., approximately 3.5 volts), the unselected word lines (WL_unsel) are raised to Vread (e.g., approximately 5.5 volts), the selected word line WLn is raised t0 the read compare voltage Vcgr (e.g., Vra, Vrb, . . . ) for a read operation or a verify compare level (e.g., Vva, Vvb, . . . ) for a verify operation. The voltage Vread act as an overdrive or pass voltage because it causes the unselected memory cells to turn on and act as pass gates. At time t2, the source side select gate is turned on by raising SGS (B) to Vdd. This provides a path to dissipate the charge on the bit line. If the threshold voltage of the memory cell selected for reading is greater than Vcgr or the verify compare level applied to the selected word line WLn, then the selected memory cell will not turn on and the bit line will not discharge, as depicted by signal line 450. If the threshold voltage in the memory cell selected for reading is below Vcgr or below the verify compare level applied to the selected word line WLn, then the memory cell selected for reading will turn on (conduct) and the bit line voltage will dissipate, as depicted by curve 452. At some point after time t2 and prior to time t3 (as determined by the particular implementation), the sense amplifier will determine whether the bit line has dissipated a sufficient amount. At time t3, the depicted signals will be lowered to Vss (or another value for standby or recovery). Note that in other embodiments, the timing of some of the signals can be changed (e.g. shift the signal applied to the neighbor).

Next, the behavior of the sensing circuits and the array of memory cells that measure the conduction current of a memory cell by the rate it discharges a dedicated capacitor in the sense amplifier will be discussed with respect to SGS (C) and Selected BL (C). At time t1 of FIG. 12, SGD is raised to Vdd (e.g., approximately 3.5 volts), the unselected word lines (WL_unsel) are raised to Vread (e.g., approximately 5.5 volts), the selected word line WLn is raised to read compare level Vcgr for a read operation or a verify compare level for a verify operation. In this case, the sense amplifier holds the bit line voltage constant regardless of what the NAND sting is doing, so the sense amplifier measures the current flowing with the bit line "clamped" to that voltage. At some point after time t1 and prior to time t3 (as determined by the particular implementation), the sense amplifier will determine whether the capacitor in the sense amplifier has dissipated a sufficient amount. At time t3, the depicted signals will be lowered to Vss (or another value for standby or recovery). Note that in other embodiments, the timing of some of the signals can be changed.

Looking back at FIG. 6, the read compare points Vra and Vrb are between, but not within, any of the data states (threshold voltage distributions). In FIG. 7, however, the sixteen data states (threshold voltage distributions) are overlapping. Therefore, the read compare points will likely be (but are not required to be) within one or two of the data states (threshold voltage distributions). For example, FIG. 7 shows fifteen read compare points (or voltage levels) Vr1, Vr2, Vr3, Br4, Vr5, Vr6, Vr7, Vr8, Vr9, Vr10, Vr11, Vr12, Vr13, Vr14 and Vr15. Vr1 is depicted to be within the intersection of state 0 and state 1. Vr2 is depicted to be within the intersection of state 1 and state 2. Vr3 is depicted to be within the intersection of state 2 and state 3. Vr4 is depicted to be within the intersection of state 3 and state 4. Vr5 is depicted to be within the intersection of state 4 and state 5. Vr6 is depicted to be within the intersection of state 5 and state 6. Vr7 is depicted to be within the intersection of state 6 and state 7. Vr8 is depicted to be within the intersection of state 7 and state 8. Vr9 is depicted to be within the intersection of state 8 and state 9. Vr10 is depicted to be within the intersection of state 9 and state 10. Vr11 is depicted to be within state the intersection of 10 and state 11. Vr12 is depicted to be within state the intersection of 1 and state 12. Vr13 is depicted to be within the intersection of state 12 and state 13. Vr14 is depicted to be within the intersection of state 13 and state 14. Vr15 is depicted to be within the intersection of state 14 and state 15.

By determining whether a memory cell conducts current in response to the fifteen read compare points, it is possible to determine which state the memory cell is in. For example, if the memory cell conducts in response to Vr1, the memory cell is in state 0. If the memory cell only conducts in response to Vr15, the memory cell is in state 14. If the memory cell does not conduct in response to any of the read compare points, then the memory cell is in state 15. If the memory cell does not conduct in response to Vr1, Vr2 and Vr3, but does conduct in response to Vr4, then the memory cell is in state 3. And so on.

As depicted, the data states (threshold voltage distributions) of FIG. 7 are overlapping. Thus, some memory cells in state 4 may have a threshold voltage that is in the intersection of states 3 and 4, and may be below Vr4. It is anticipated, that if the read compare points are set properly, then any potential errors due to the memory cells being in the intersection of below/above read compare point will be taken care of by ECC. However, if the read compare points are not accurate, then there could be an error when reading the data.

Figure 13:
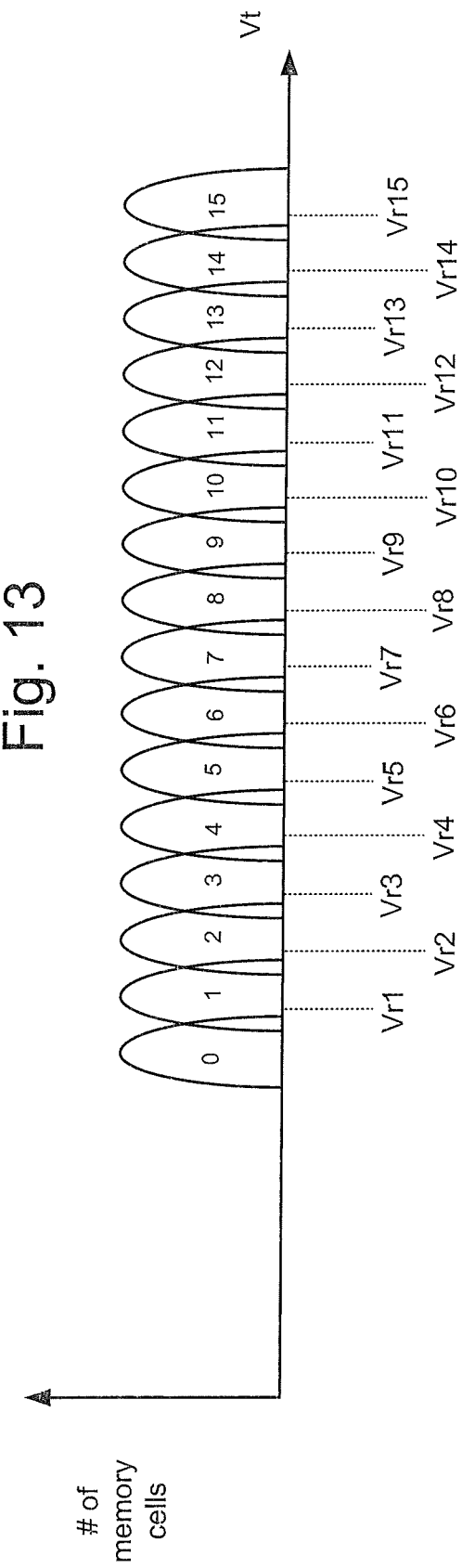
FIG. 13 depicts an example set of threshold voltage distributions.

For various reasons, a population of non-volatile memory cells could have their threshold voltages drift over time. Data retention issues causing charge loss/gain, program disturb, temperature difference between the time the cells were programmed and the time that they are read, read disturb, back pattern effect, and capacitive coupling between adjacent floating gates are all phenomena known in the art for causing changes to threshold voltages (or apparent threshold voltages) of non-volatile memory cells. A shifting of threshold voltages for a population of memory cells can cause the read compare points to be inaccurate. For example, FIG. 13 shows the data states (threshold voltage distributions) of FIG. 7 after a shift of the threshold voltages of the entire population of memory cells. As can be seen, the read compare points Vr1, Vr2, . . . , Vr15 are no longer lined up properly. This can cause an error when reading data. Therefore, the technology described herein seeks to dynamically and adaptively update the read compare points (voltage levels) based on memory cell threshold voltage distribution. One embodiment updates the read compare points when an error occurs. Another embodiment updates the read compare points periodically when the memory system has idle time or can otherwise perform the operation without materially effecting user perceived performance.

Figure 14:
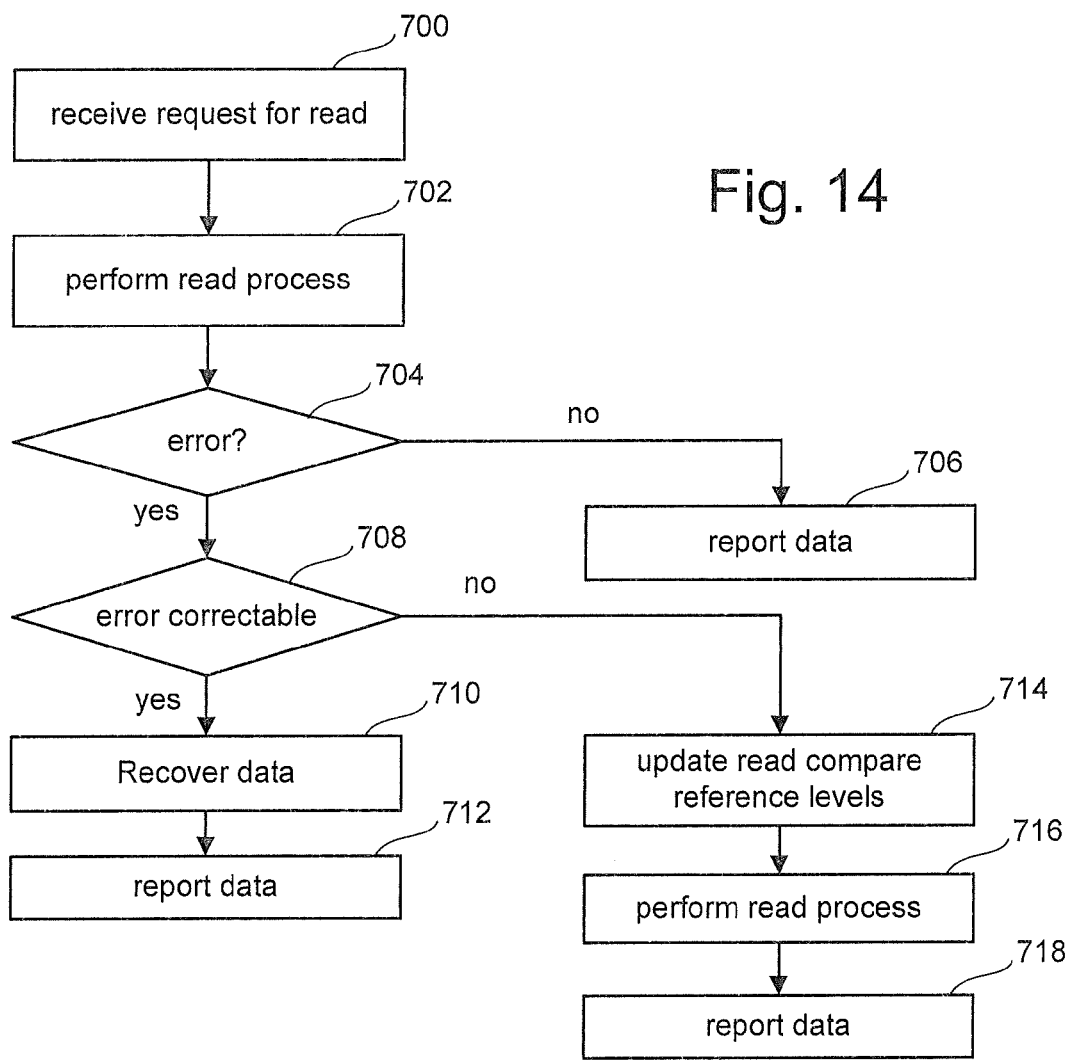
FIG. 14 is a flow chart describing one embodiment of read data in a non-volatile memory system.
Figure 15:
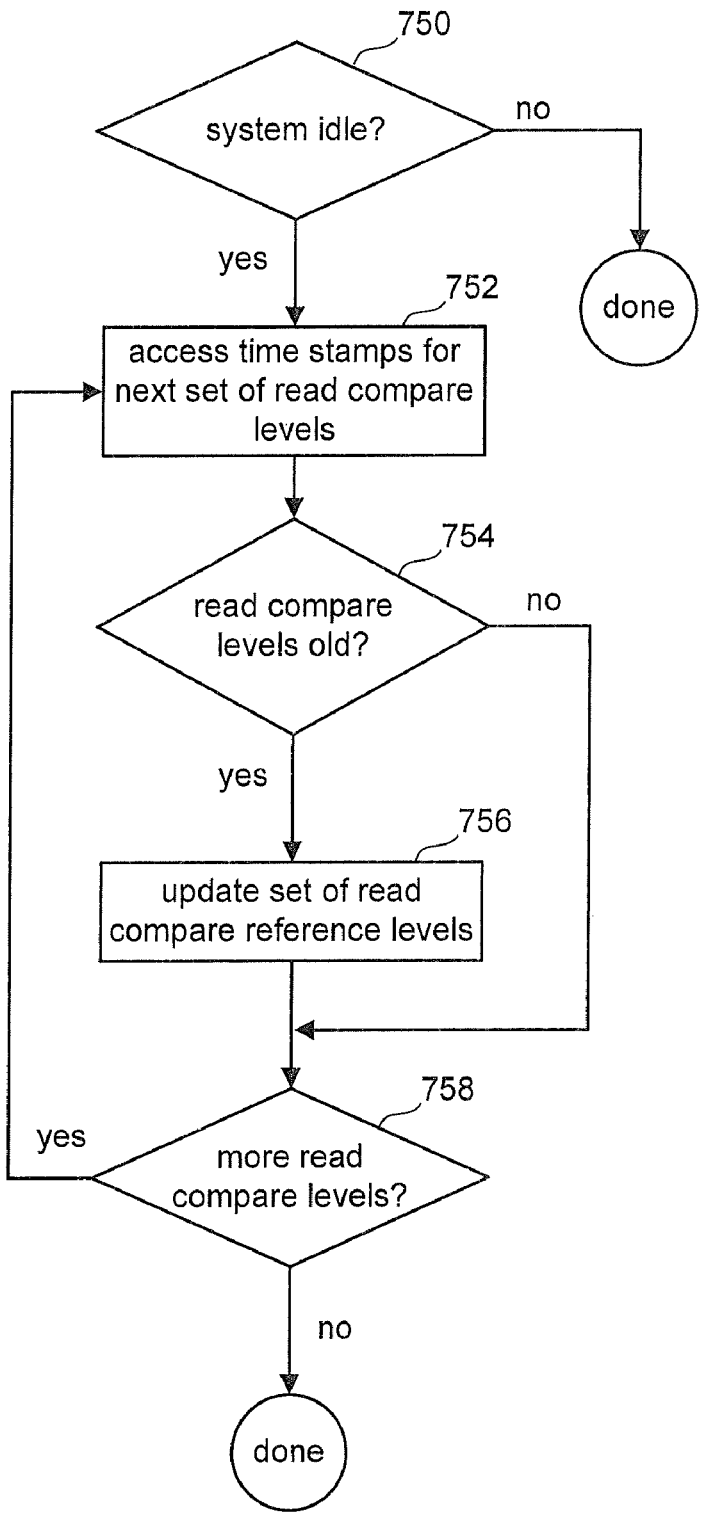
FIG. 15 is a flow chart describing one embodiment of a process performed for updating a non-volatile memory system during idle time.

FIG. 14 is a flow chart describing a process for reading data that updates the read compare points when an error occurs. FIG. 15 is a flow chart describing a process for reading data that updates the read compare points periodically when the memory system has idle time or can otherwise perform the operation without materially effecting user perceived performance. It is possible for a memory system to implement the processes of both FIG. 14 and FIG. 15.

FIG. 14 provides the read process at the system level. In step 700, a request to read data is received. In step 702, a read operation is performed for a particular page in response to the request to read data. In one embodiment, when data for a page is programmed, the system will also create extra bits used for Error Correction Codes (ECCs) and write those ECC bits along with the page of data. ECC technologies are well known in the art. The ECC process used can include any suitable ECC process known in the art. When reading data from a page, the ECC bits will be used to determine whether there are any errors in the data (step 704). The ECC process can be performed by the controller, the state machine or elsewhere in the system. If there are no errors in the data, the data is reported at step 706. For example, data will be communicated to a controller or host. If an error is found at step 704, it is determined whether the error is correctable (step 708). Various ECC methods have the ability to correct a predetermined number of errors in a set of data. If the ECC process can correct the data, then the ECC process is used to correct and recover that data in step 710 and the data, as corrected, is reported to the host or controller in step 712.

If the data is not correctable by the ECC process, a data recovery process is performed. In a certain class of ECC schemes, namely Strong ECC (or SECC), when the ECC engine is presented with an overwhelming number of bad bits on a page, the SECC engine will continue its iterative process and will never converge to the correct answer. Therefore, if the SECC engine takes too long to correct the data, the iterative convergence process can be stopped, and a data recovery process can be performed. In step 714, the read compare levels for the data attempted to be read will be updated. In step 716, a read process will be performed using the new read compare levels in order to determine the data stored in the memory cells. In step 718, the data will be reported to the host or controller. The read process of steps 702 and 716 include performing the operation of FIG. 12 for each read compare point and then determining the appropriate data state for each memory cell.

FIG. 15 is a flow chart describing a process for reading data that updates the read compare points periodically when the memory system has idle time or can otherwise perform the operation without materially effecting user perceived performance. The process of FIG. 15 can be performed periodically or continuously. In step 750, the state machine (or controller, or other device) will determine whether the memory system is idle. If not, the method of FIG. 15 is completed. If the memory system is idle, then a time stamp for the next set of read compare points is accessed. In one embodiment, there is one set of read compare points for the entire system. In another embodiment, each block, word line or other unit of data will have its own set of read compare points and each set will have its own time stamp. The first time that step 752 is performed, a time stamp for any of the various sets of read compare points is accessed. Each subsequent iteration of step 752 during a performance of the process of FIG. 15 will access another set of time stamps for another word line, block, etc. In one embodiment, multiple sets of read compare points can share a common time stamp. In step 754 of FIG. 15, the system will determine if the accessed time stamp indicates that the associated read compare points are older than a predetermined threshold (e.g., two weeks, two months, etc.). If so, then the set of read compare points associated with the currently chosen time stamp are updated in step 756. If the accessed read compare points are not older than the predetermined threshold, then step 756 is skipped. In step 758, it is determined whether there are more sets of read compare levels. If there are more sets of read compare levels that need to be considered, then the process loops back to step 752 and the next time stamp for the next set of read compare levels is processed. If there are no more sets of read compare levels that need to be considered in this performance of the method of FIG. 15, then the method of FIG. 15 is completed.

One set of read compare points can be obtained per word line. The memory cells (or a subset of the memory cells) that reside on one word line can form one or more ECC pages. A portion (e.g. one quarter) of the cells that reside on the same word line may constitute an ECC page. In one embodiment, one set of read compare points per word line will be appropriate for all the ECC pages on that word line. To save time, the same set of read compare points obtained on one word line may be used on all other word lines in the same block. If information about the time of the last update of the read compare points for a given ECC page is not available, then the rate at which the read compare points are updated in the background can be adjusted such that no word line's read compare points are updated more often than a predetermined amount of time even if the memory system is continuously powered up and idle.

Figure 16:
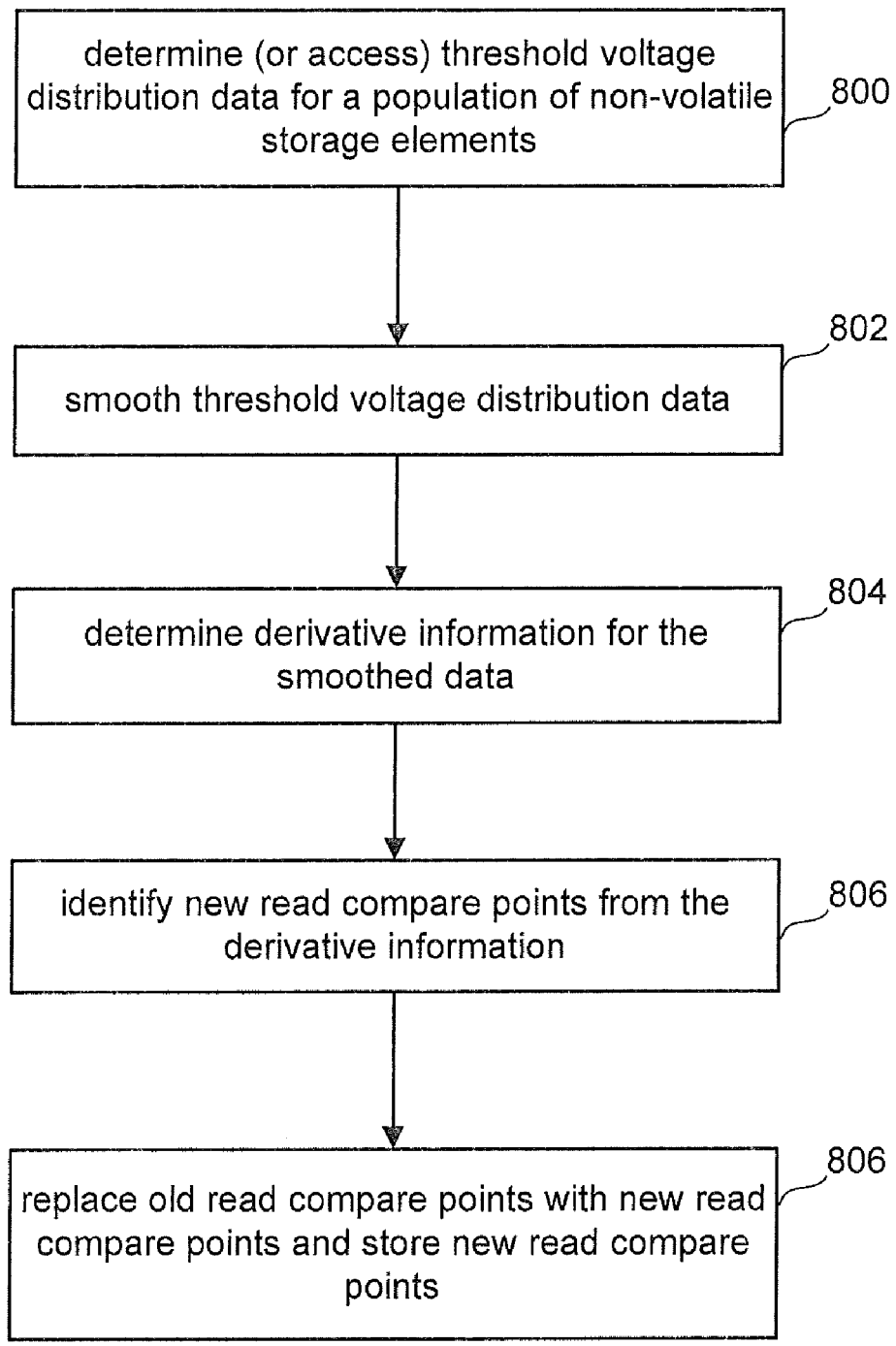
FIG. 16 is a flow chart describing one embodiment of a process for updating read compare levels.

FIG. 16 is a flow chart that describes a set of embodiments for updating read compare levels (step 714 of FIG. 14 or step 756 of FIG. 15). In step 800, threshold voltage distribution data is determined for a population of memory cells. In one embodiment, the threshold voltage distribution data is determined for all memory cells connected to a single word line, all memory cells in a block, all memory cells in an array of memory cells, or another unit of memory cells. In one example, the threshold voltage distribution data provides information about the number of memory cells at each measured threshold voltage value. Other types and forms of threshold voltage distribution data can also be used. In step 802, the threshold voltage distribution data is smoothed. Any one of many suitable known functions can be uses to smooth the threshold voltage distribution data. For example, a low pass filter can be used to smooth the data. Other examples of suitable functions are provided below. In step 804 of FIG. 16, the derivative of the smoothed data is determined. There are many ways and forms to create and store information about the derivative, with no one particular way or form required. In step 806, the output of derivative calculation is investigated to look for zero crossings. In one embodiment, zero crossings of the derivative data from negative derivative data values transitioning to positive derivative data values, as word line voltage is increased, represent read compare points. In other embodiments, the scale, form or range of the data could be different and the process would look for other data landmarks (including crossing other thresholds) as an indication of the read compare points. In step 808, the new read compare points found in step 806 are used to replace the old read compare points. In one embodiment, the new read compare points are stored as parameters in registers/latches in the controller 244 or control circuitry 220 to be used immediately. In another embodiment, the new read compare points are stored as parameters in non-volatile memory for future use. The preferred type of non-volatile memory for such parameters storage is the binary type which would allow more updates as it is more immune to degradation due to program/ erase cycles.

The process of FIG. 16 can be completely performed on memory chip 212 (e.g., at the direction of state machine 222) or it can be performed by a combination of memory chip 212 and controller 244. In one implementation, the controller issues a command to the state machine to update the read compare points. In another implementation, the state machine determines when to update the read compare points. In one example, the controller requests the threshold voltage distribution data from the memory chip 212 and then the controller issues commands to the memory, receives data from memory that allows it to perform steps 802-806. Other divisions of labor can also be used.

Figure 17:
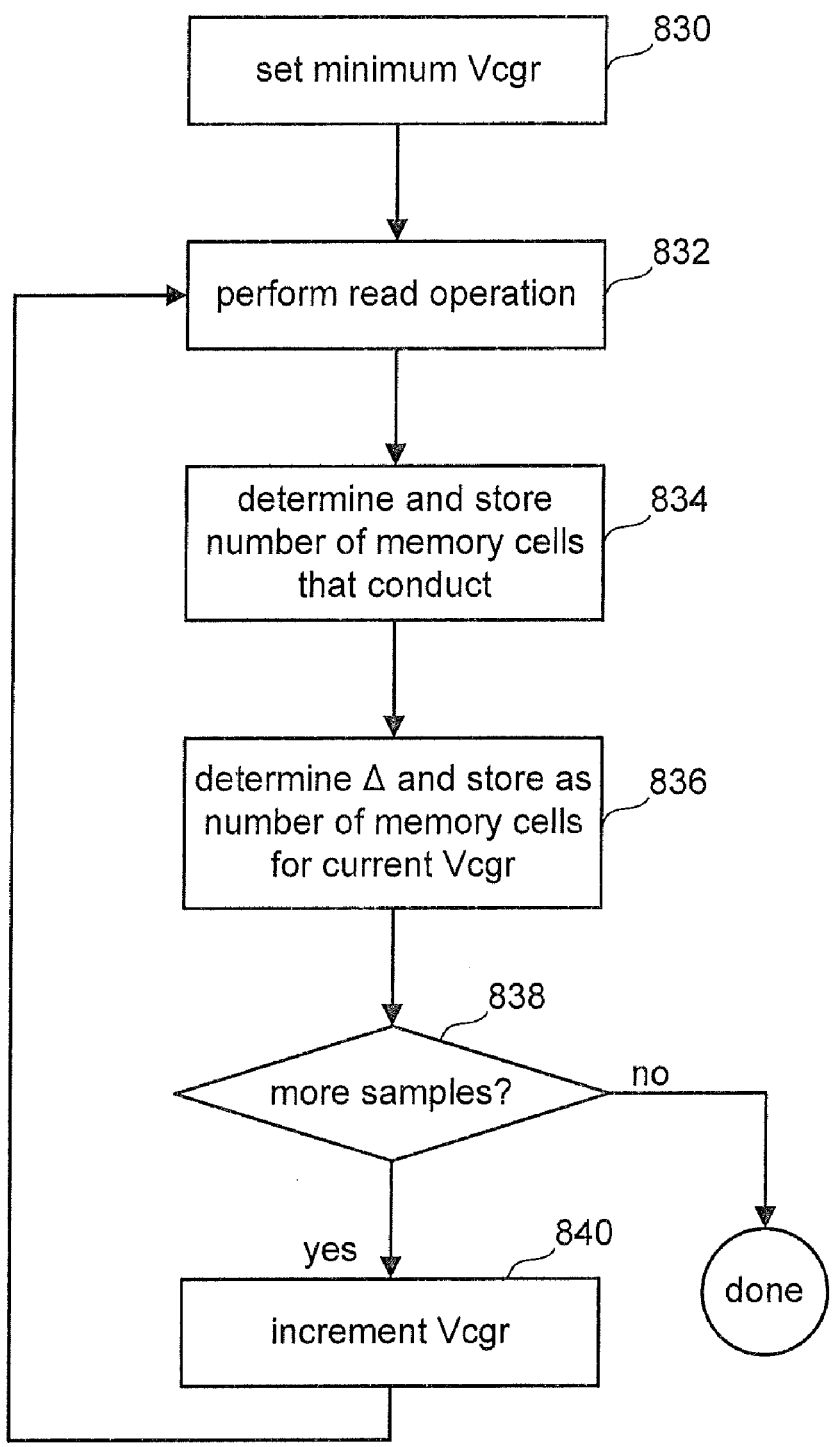
FIG. 17 is a flow chart describing one embodiment of a process for determining threshold voltage distribution data.

FIG. 17 is a flow chart describing one embodiment of determining threshold voltage distribution data for a population of memory cells (step 800 of FIG. 16). In one embodiment, the read operation is performed for all of the memory cells connected to a selected word line. In step 830 of FIG. 17, the minimum value for read compare voltage Vcgr is set (e.g., −2.4 volts). In step 832 a read operation is performed using the Vcgr set in step 830. For example, the process of FIG. 12 is performed with the current value of Vcgr being applied to the selected word line. The number of memory cells that conducted (turn on) in response to Vcgr being applied to their respective control gates (via the selected word line) is determined and stored (step 834). The difference between the number of memory cells that conducted (turned on) in response to the current Vcgr and the number of memory cells that conducted (turned on) in response to the previous Vcgr is determined. That difference represents the number of memory cells having a threshold voltage at the current Vcgr. The first time that steps 832-836 are performed, the number of memory cells that conducted (turned on) in response to the previous Vcgr is zero. If there are more samples to consider (step 838), then Vcgr is incremented in step 840 and the process loops back to step 832. In one embodiment, Vcgr is incremented by 0.025 volts. However, other increment sizes can also be used. When the process loops back to step 832, another read operation is performed for the new Vcgr, the number of conducting memory cells is determined (step 834) and the new delta (step 836) is calculated. When there are no more samples to collect (e.g., Vcgr=5.0 volts or all memory cells have had there threshold voltage determined), then the process of FIG. 17 is complete. In another embodiment, a maximum Vcgr has been previously specified. If after step 840 the maximum Vcgr has been reached, then all remaining memory cells are assigned this maximum Vcgr. At this point, the data collected is an array of tuples, where each tuple includes a threshold voltage and an indication of the number of memory cells that are at that threshold voltage. In one embodiment, the process of FIG. 17 is performed at the direction of state machine 222.

Figure 18:
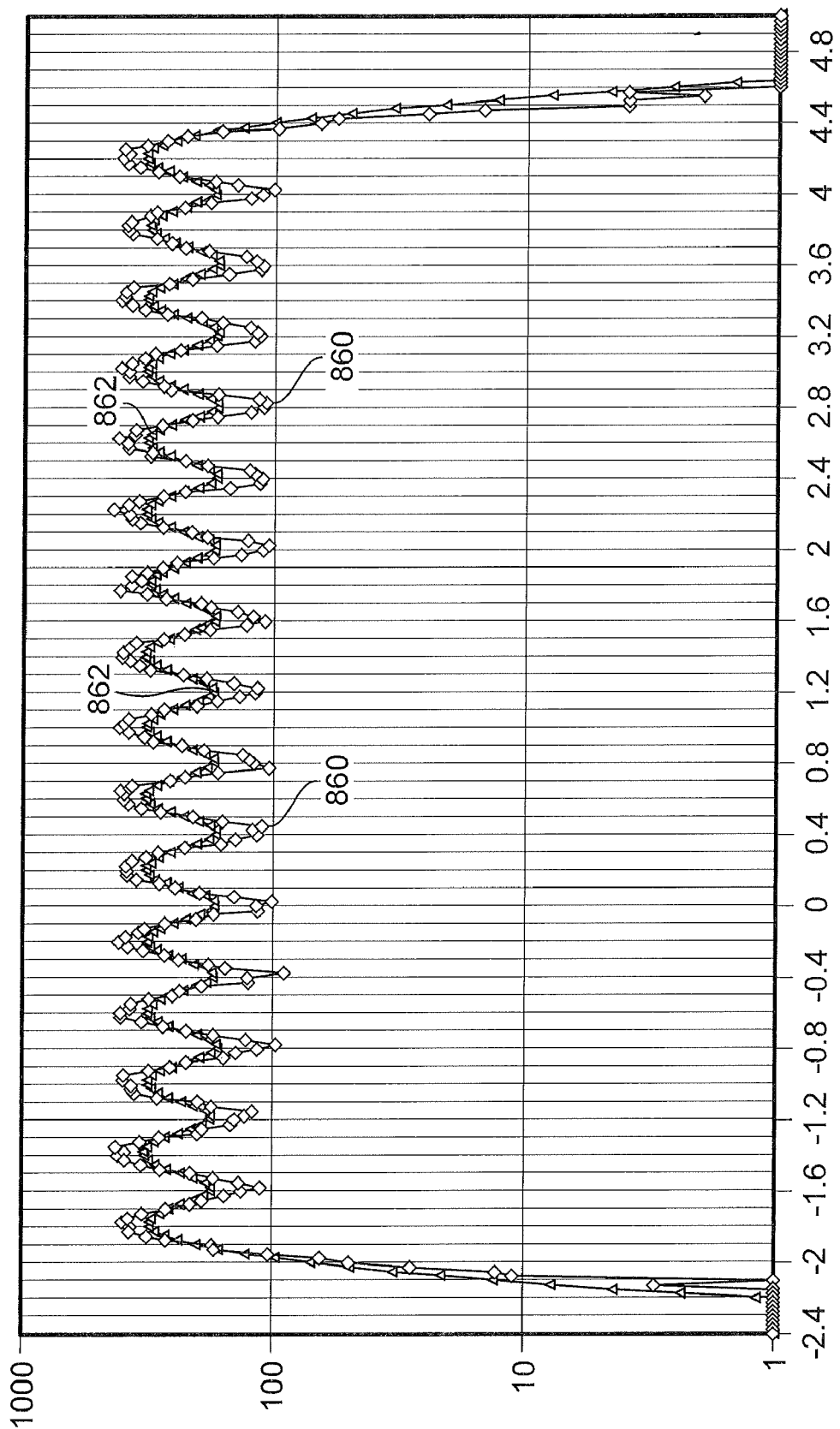
FIG. 18 is a graph of threshold voltage distribution data.
Figure 19:
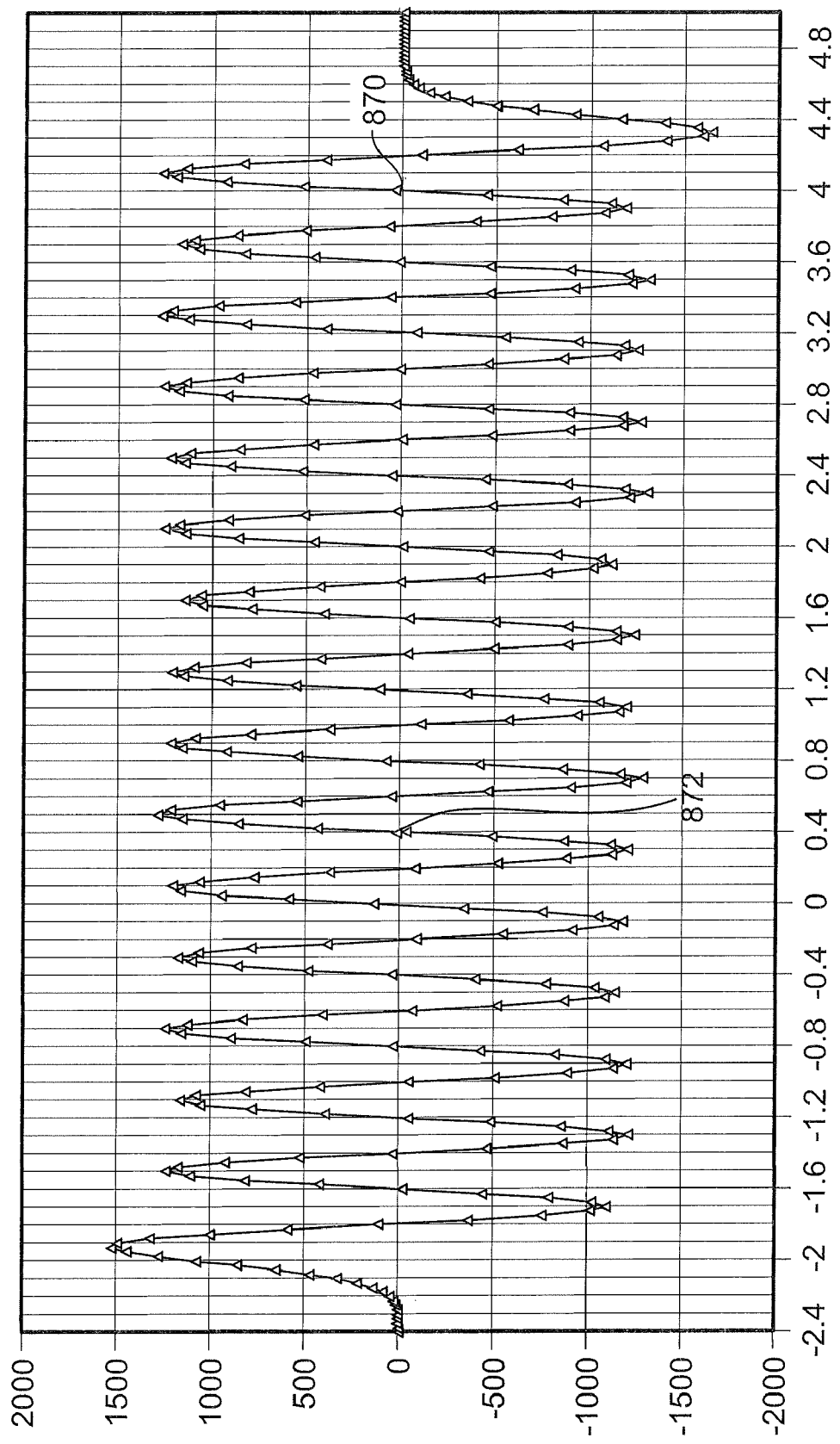
FIG. 19 is a graph showing the result of a derivative calculation

Distribution function (cell count as a function of control gate voltage) 860 of FIG. 18 provides one example of threshold voltage distribution data that is the result of the process of FIG. 17, which is one example of implementing step 800 of FIG. 16. Distribution function 862 of FIG. 18, which shows a smoothed version of distribution function 860, is one example of the result from step 802 of FIG. 16. FIG. 19 depicts the derivative of distribution function 862, which is an example of the result of step 804 of FIG. 16. Step 806 includes identifying zero crossings from negative values to positive values along the waveform of FIG. 19. Points 870 and 872 are two examples of zero crossings from negative values to positive values depicted in FIG. 19, and both can be read compare points. In one embodiment, the zero crossings are obtained by interpolation between pairs of neighbor derivative data.

FIG. 20 is a flow chart that describes an alternative embodiment of the process of FIG. 16. In step 900, threshold voltage distribution data is determined for a population of memory cells. Step 900 is similar to step 800. In step 902, the threshold voltage distribution data is smoothed by convolving the threshold voltage distribution data with a function. In one set of examples, a weighted function is used. In one embodiment, a Gaussian function is. In another embodiment, the function is a truncated Gaussian so that the front and back tails of the Gaussian function are removed to look like FIG. 20A. In other embodiments, functions (weighted and not weighted) other than a Gaussian can be used. Note that smoothed distribution function 862 of FIG. 18 provides an example of smoothing the threshold voltage distribution data by convolving the threshold voltage distribution data with the Gaussian function. In step 904, the derivative of the smoothed data is determined. Step 904 is similar to step 804. In step 906, the output of derivative calculation is investigated to look for negative to positive transitioning zero crossings in order to identify new read compare points. Step 906 is similar to step 806. In step 908, the new read compare points found in step 906 are used to replace the old read compare points. Step 908 is similar to step 808.

The table below provides an example set of data representing twenty one points along a Gaussian curve used for the convolution operation in step 902. As can be seen, the Gaussian serves as a weighting function.

| |
|---|
| 2.73E−12 |
| 3.15E−10 |
| 2.21E−08 |
| 9.39E−07 |
| 2.42E−05 |
| 0.000379 |
| 0.003595 |
| 0.020685 |
| 0.072198 |
| 0.152842 |
| 0.196254 |
| 0.152842 |
| 0.072198 |
| 0.020685 |
| 0.003593 |
| 0.000379 |
| 2.42E−05 |
| 9.39E−07 |
| 2.21E−08 |
| 3.15E−10 |
| 2.73E−12 |

FIG. 21 is a flow chart that describes an alternative embodiment of the process of FIG. 16. In step 920, threshold voltage distribution data is determined for a population of memory cells. Step 920 is similar to step 800. In step 922, the threshold voltage distribution data is smoothed by convolving the threshold voltage distribution data with a skewed function. In one embodiment, the function is a Gaussian function that will be skewed as described below; however, other functions can also be skewed and used in step 922. In step 924, the derivative of the smoothed data is determined. Step 924 is similar to step 804. In step 926, the output of derivative calculation is investigated to look for zero crossings in order to identify new read compare points. Step 926 is similar to step 806. In step 928, the new read compare points found in step 926 are used to replace the old read compare points. Step 928 is similar to step 808.

FIG. 7 shows the threshold voltage distributions for each state as being symmetrical. However, in many cases, the threshold voltage distributions are not symmetrical. It has been observed in some cases that one side of a threshold voltage distribution may have a different slope than the other side of the threshold voltage distribution. For example, the threshold voltage distribution waveform of FIG. 21A has a more gradual slop on side 930L and a more steep slope on side 930R. Because of the difference in slopes of the two sides of the threshold voltage distribution, some embodiments will skew the Gaussian function in order to accommodate the skew in distribution data. One example of skewing the Gaussian function is to multiply it by a line characterized by the equation Y=mx+b, where m and b could be positive or negative. In one implementation, the skewing is constant so that the Gaussian function is multiplied by the same equation along the entire range of threshold voltages. In another embodiment, the equation for the line can change over the range of threshold voltages. In one option Y=mx+b is used for lower threshold voltages (lower data states) and Y=−mx+b is used for higher threshold voltages (higher data states). One reason for doing this is that the steep slope can be at the upper end of a threshold voltage distribution for higher states (possibly because of data retention issues) so the process may want to give more weight to higher threshold voltages. On the other hand, the steep slope can be at the lower end of a threshold voltage distribution for lower states (possibly because of program disturb issues) so the process may want to give more weight to lower threshold voltages. In another option, the equation for the line can change for each data state by adjusting m from a high positive number toward zero and then to a high negative number when going from low data states to high data states.

In another embodiment, the width of the Gaussian function can be changed by changing the sigma for the Gaussian function. For example, one sigma could be used for low data states and a different sigma could be used for high data states. Alternatively, the sigma could change for each data state.

Figure 22:
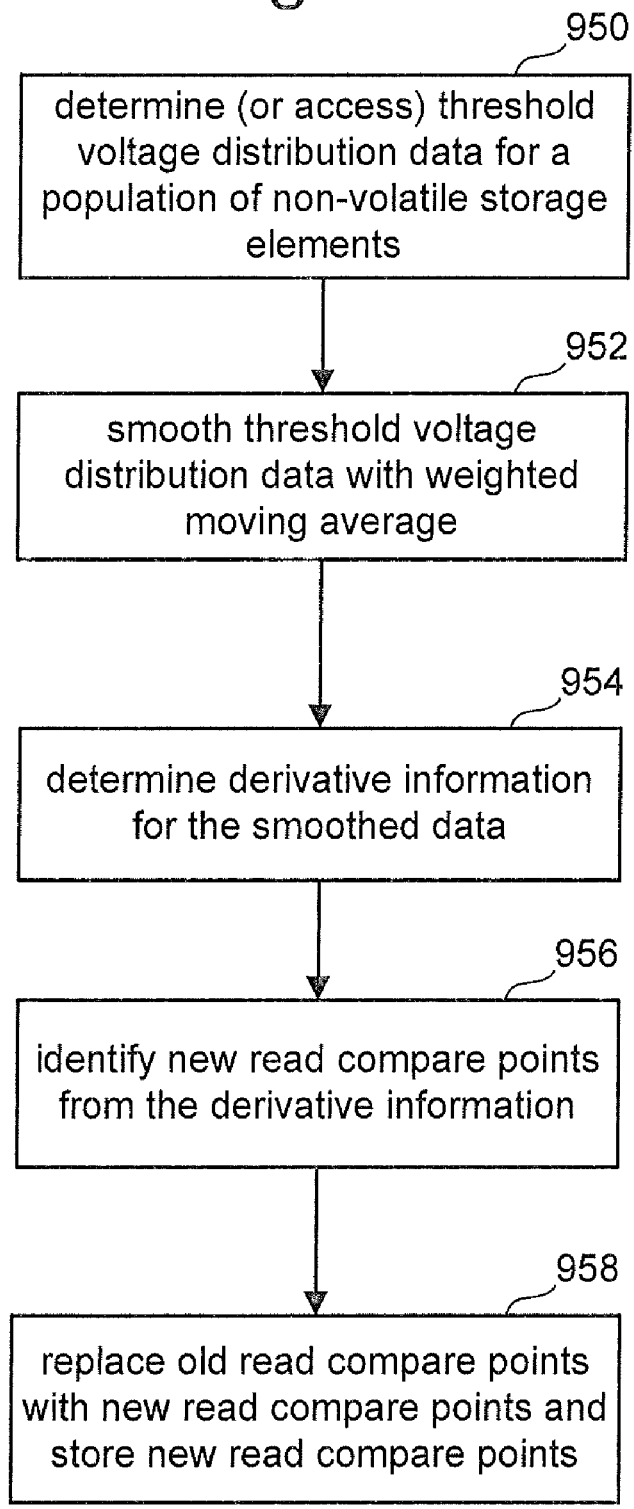
FIG. 22 is a flow chart describing one embodiment of a process for updating read compare levels.

FIG. 22 is a flow chart that describes an alternative embodiment of the process of FIG. 16. In step 950, threshold voltage distribution data is determined for a population of memory cells. Step 950 is similar to step 800. In step 952, the threshold voltage distribution data is smoothed by using a weighted moving average. One example is to perform a convolution of the threshold voltage distribution data with a rectangular function. Other means for calculating a weighted moving average can also be used. In step 954, the derivative of the smoothed data is determined. Step 954 is similar to step 804. In step 956, the output of derivative calculation is investigated to look for zero crossings in order to identify new read compare points. Step 956 is similar to step 806. In step 958, the new read compare points found in step 956 are used to replace the old read compare points. Step 958 is similar to step 808.

FIG. 23 is a flow chart that describes an alternative embodiment of the process of FIG. 16. In step 1000, threshold voltage distribution data is determined for a population of memory cells. Step 1000 is similar to step 800. In step 1002, the threshold voltage distribution data is squared. This may serve to provide more contrast for the data. In step 1004, the square of threshold voltage distribution data is smoothed using any of the methods discussed above. In step 1006, the derivative of the smoothed data is determined. Step 1006 is similar to step 804. In step 1008, the output of derivative calculation is investigated to look for zero crossings in order to identify new read compare points. Step 1008 is similar to step 806. In step 1010, the new read compare points found in step 1008 are used to replace the old read compare points. Step 1010 is similar to step 808.

FIG. 24 is a flow chart describing another embodiment of determining read compare points. In step 1040, an initial set of new read compare points are determined using the process of FIG. 20 or 21, with a larger sigma for the Gaussian function. By using the larger sigma, the process of determining a new set of read compare points will be less precise. In step 1042, the original data of threshold voltage distribution data (see steps 900, 920, etc) is accessed. In step 1044, minima are searched for in the original data of threshold voltage distribution data in the vicinity of the initial set of new read compare points from step 1040. For example, the wave form 860 of FIG. 18 could be searched for minima within the vicinity of the initial set of new read compare points. In this manner, the initial set of new read compare points serves as a seed for a search algorithm.

FIG. 25 is a flow chart describing another embodiment of determining read compare points. In this embodiment, the new read compare points are adjusted by one or more offsets. In step 1100, the one or more offsets are determined. In step 1102, an initial set of new read compare points are determined using the process of FIGS. 16, 20, 21, 22, 23 or another process. In step 1104, the initial set of new read compare points are adjusted by the one or more offsets. In one example, one offset is used to adjust all of the new read compare points. In another embodiment, each new read compare point is adjusted by a different offset. In yet another embodiment, groups of new read compare points are adjusted by a different offset for each group.

Steps 1120-1134 provide one example of a process for determining one or more offsets (step 1100) using device characterization. In step 1120, one or more memory chips 212 are cycled many times (e.g., thousand or tens of thousands of times). For example, the memory is programmed and erased as many times as the maximum number of cycles allowed by specifications of the product (e.g., four thousand or other number). In step 1122, a data pattern is written to the memory cells. In step 1124, the one or more memory chips 212 are baked in an oven accelerate charge loss/gain. In step 1126, new read compare points are determined using any of the methods described above. In step 1128, a read process is performed using the new read compare points. In step 1130, the data measured in step 1128 is compared to the actual data. In step 1132, an error is calculated. In step 1134 adjustments are made to the read compare points and the error is recalculated. Trial and error can be used to make a large amount of guesses at the adjustments in order to minimize the error. A computer can be used to guess at the adjustments and calculate the new error in the attempt to minimize the error. The adjustments made to minimize the error are the offset to be used in step 1104. In one embodiment, each read compare points has a separate offset. In another embodiment, all of the calculated offsets are averaged to calculate a single offset foe all read compare points.

Another method that can be employed to determine each read point's offset value individually does not require any pre-characterization of the memory. This method can use any of the procedures discussed above to find the zero crossing of the derivative of the smoothed distribution function. It may be preferable to use a non-skewed function (e.g. a regular Gaussian) for the smoothing operation in order not to end up over-skewing the read levels. In this method, once the minima of the smoothed distribution function are determined, the values at X volts to the right and to the left of each minimum are observed and compared to each other. The difference in the two values or the ratio of the values can be used to obtain the sign and the magnitude of the offset for each and every read level. The tails of each distribution can often be modeled by an exponential function. A simple mathematical study can show that when two neighbor distributions merge into one another with one's upper tail overlapping the other's lower tail what happens to the position of the minimum of the sum of the two distributions (which is the only distribution function that can be measured if one does not have prior knowledge of the data was written to the page). Typically, the ideal read level that minimizes the error is where the two distributions cross each other. However, we do not have information about the two individual distributions, as we do not know the data that was written to the page. As a result we have to rely on the only information that is available which is the sum or superposition of all the states' distributions. The superposition distribution (e.g. plot 860 of FIG. 8) is the only available information. Once the local minima of the distribution function or of the smoothed function are obtained, one can look up values of the distribution function or the smoothed distribution function at, for example, 75 mV to the right and to the left of each local minimum. The sizes of these surrounding values can be compared with one another (by dividing one by the other and obtaining a ratio R) to gauge the asymmetry in the tails of the two neighbor distributions. With this asymmetry gauged, and a prior mathematical analysis that has already shown how much offset is required for various degrees of asymmetry in shape of the upper tail of State N as compared to the shape of the lower tail of State N+1 distributions. The required offset values can be looked up in a table whose input is the value of the ratio R. In another embodiment, the table's input will be the value of the ratio R1, in addition to information such as the maxima of the two neighbor peaks of the smoothed function, or the ratio of each one of these maxima to the smoothed minimum. This maximum to minimum ratio, and there are two of them per read level, are a good gauge of how wide each state's distribution is. The width of each of the two neighbor states may have a bearing on the offset value for the read level residing between the two states.

The processes discussed above for reading data, including determining new read compare points, can be used to read data after the data is programmed or can be used as part of a verify process during programming.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:
   accessing threshold voltage distribution data for a population of non-volatile storage elements;
   operating on the threshold voltage distribution data to create transformed threshold voltage distribution data; and
   identifying read compare points based on the transformed threshold voltage distribution data;
   replacing old read compare points with the identified read compare points; and
   performing one or more read operations using the identified read compare points.

2. A method according to claim 1, wherein the operating on the threshold voltage distribution data comprises:
   calculating derivative information for the threshold voltage distribution data, the read compare points are identified from the derivative information.

3. A method according to claim 2, wherein the operating on the threshold voltage distribution data comprises:
   smoothing the threshold voltage distribution data prior to calculating the derivative information.

4. A method according to claim 3, wherein the smoothing the threshold voltage distribution data comprises:
   convolving the threshold voltage distribution data with a truncated Gaussian function to create an interim set of data, the derivative information is calculated from the interim set of data.

5. A method according to claim 3, wherein the smoothing the threshold voltage distribution data comprises:
   smoothing the threshold voltage distribution data using a weighted function to create an interim set of data, the derivative information is calculated from the interim set of data.

6. A method according to claim 5, wherein:
   the weighted function is a truncated Gaussian function multiplied by a sloped line.

7. A method according to claim 5, wherein:
   the weighting function is a skewed and truncated Gaussian function.

8. A method according to claim 5, wherein:
   the weighting function is skewed in a manner that changes the skew over the data set.

9. A method according to claim 5, wherein:
   the weighting function is a weighted moving average.

10. A method according to claim 3, further comprising:
    squaring the threshold voltage distribution data prior to smoothing.

11. A method according to claim 3, further comprising:
    applying a constant offset to the identified read compare points.

12. A method according to claim 3, further comprising:
    applying a changing offset to the identified read compare points.

13. A method according to claim 3, wherein
    the smoothing the data is performed with a low pass filter.

14. A method according to claim 3, wherein the identifying read compare points includes:
    identifying and storing negative to positive zero crossings in the derivative information.

15. A method according to claim 2, wherein the identifying read compare points includes:
    identifying and storing negative to positive zero crossings in the derivative information.

16. A method according to claim 1, further comprising:
    determining the threshold voltage distribution data.

17. A method according to claim 1, wherein the operating on the threshold voltage distribution data to create transformed threshold voltage distribution data comprises:
    convolving the threshold voltage distribution data with a Gaussian function.

18. A method according to claim 17, wherein:
    the Gaussian function is a truncated Gaussian function.

19. A method according to claim 17, wherein:
    the Gaussian function is a skewed and truncated Gaussian function.

20. A method according to claim 1, wherein the operating on the threshold voltage distribution data to create transformed threshold voltage distribution data comprises:
    convolving the threshold voltage distribution data with a function.

21. A method according to claim 1, wherein the operating on the threshold voltage distribution data to create transformed threshold voltage distribution data includes:
    squaring the threshold voltage distribution data.

22. A method according to claim 1, further comprising:
    applying one or more offsets to the read compare points.

23. A method according to claim 1, further comprising:
    applying a changing offset to the read compare points.

24. A method according to claim 1, further comprising:
    searching for minima in the threshold voltage distribution data near the read compare points;
    replacing old read compare points with the minima; and
    performing one or more read operations using the minima.

25. A method for operating non-volatile storage, comprising:
    determining threshold voltage distribution data for a population of non-volatile storage elements;
    smoothing said threshold voltage distribution data using a weighted function to create an interim set of data;
    determining a derivative of the interim set of data;
    identifying new read compare values based on negative to positive zero crossings of the derivative; and performing one or more read operations using the new read compare values.

26. A method according to claim 25, wherein:
the identifying new read compare values includes applying one or more offsets to the negative to positive zero crossings and storing the offset negative to positive zero crossings as the new read compare values.

27. A method according to claim 25, wherein:
the new read compare values are indications of voltage levels for differentiating between multiple data states for multi-state flash memory.

28. A method for operating non-volatile storage, comprising:
determining threshold voltage distribution data for a population of flash memory devices;
convolving said threshold voltage distribution data with a Gaussian function to create an interim set of data;
determining a derivative of the interim set of data;
identifying negative to positive zero crossings of the derivative;
storing new read compare values based on the identified negative to positive zero crossings of the derivative; and
performing one or more read operations using the new read compare values.

29. A method according to claim 28, wherein:
the storing new read compare values based on the identified negative to positive zero crossings of the derivative includes applying one or more offsets to the negative to positive zero crossings and storing the offset negative to positive zero crossings as the new read compare values.

* * * * *